(12) United States Patent
Wilenski et al.

(10) Patent No.: US 9,587,076 B2
(45) Date of Patent: Mar. 7, 2017

(54) POLYMER NANOPARTICLES FOR CONTROLLING RESIN REACTION RATES

(71) Applicant: The Boeing Company, Chicago, IL (US)

(72) Inventors: Mark S. Wilenski, Mercer Island, WA (US); Samuel J. Meure, Fishermans Bend (AU); Michael P. Kozar, Mercer Island, WA (US)

(73) Assignee: The Boeing Company, Chicago, IL (US)

( * ) Notice: Subject to any disclaimer, the term of this patent is extended or adjusted under 35 U.S.C. 154(b) by 129 days.

(21) Appl. No.: 14/493,373

(22) Filed: Sep. 23, 2014

(65) Prior Publication Data
US 2016/0090455 A1    Mar. 31, 2016

(51) Int. Cl.
| | | |
|---|---|---|
| *C08K 9/10* | (2006.01) | |
| *C08J 5/00* | (2006.01) | |
| *C08J 7/04* | (2006.01) | |
| *H01L 23/00* | (2006.01) | |
| *C08J 5/10* | (2006.01) | |
| *C08J 3/24* | (2006.01) | |
| *B82Y 30/00* | (2011.01) | |

(52) U.S. Cl.
CPC ............... *C08J 5/005* (2013.01); *C08J 3/241* (2013.01); *C08J 5/10* (2013.01); *C08J 7/042* (2013.01); *C08J 7/045* (2013.01); *C08K 9/10* (2013.01); *H01L 24/83* (2013.01); *B82Y 30/00* (2013.01)

(58) Field of Classification Search
CPC ...................................................... C08K 9/10
See application file for complete search history.

(56) References Cited

U.S. PATENT DOCUMENTS

| | | | | |
|---|---|---|---|---|
| 3,860,565 | A | * | 1/1975 | Barber, Jr. ........... C08G 18/022 204/157.82 |
| 3,943,090 | A | | 3/1976 | Enever |
| 4,940,852 | A | | 7/1990 | Chernack |
| 5,028,478 | A | | 7/1991 | Odagiri et al. |
| 5,589,523 | A | * | 12/1996 | Sawaoka ................. C08J 3/241 427/213.3 |
| 5,605,745 | A | | 2/1997 | Recker et al. |
| 5,618,857 | A | | 4/1997 | Newberth |
| 6,503,856 | B1 | | 1/2003 | Broadway et al. |
| 6,508,897 | B1 | | 1/2003 | Yamaguchi |
| 6,518,330 | B2 | * | 2/2003 | White .................. B29C 73/163 428/402.21 |

(Continued)

FOREIGN PATENT DOCUMENTS

| | | |
|---|---|---|
| CN | 101623266 A | 1/2010 |
| EP | 0378854 | 7/1990 |

(Continued)

OTHER PUBLICATIONS

Extended European Search Report dated Feb. 17, 2016, for EP 15186474.

(Continued)

*Primary Examiner* — Vickey Nerangis

(57) ABSTRACT

A composition may include a thermosetting resin containing a plurality of polymer nanoparticles. At least some of the polymer nanoparticles may release either a catalyst or a hardener during a resin curing process. The catalyst or hardener may alter the reaction rate of the resin.

30 Claims, 15 Drawing Sheets

(56) References Cited

U.S. PATENT DOCUMENTS

| | | | |
|---|---|---|---|
| 6,740,185 B2 | 5/2004 | Baldwin | |
| 7,037,865 B1 | 5/2006 | Kimberly | |
| 7,122,250 B2 | 10/2006 | Kinsho et al. | |
| 7,435,693 B2 | 10/2008 | Tsotsis et al. | |
| 7,645,402 B2 | 1/2010 | Choi et al. | |
| 7,655,295 B2 | 2/2010 | Smith et al. | |
| 7,678,847 B2 * | 3/2010 | Yan | C08K 9/10 428/343 |
| 7,738,763 B2 | 6/2010 | Ouderkirk | |
| 8,080,313 B2 | 12/2011 | Bonneau et al. | |
| 8,283,404 B2 | 10/2012 | Allen | |
| 8,288,453 B2 | 10/2012 | Hsu et al. | |
| 8,519,505 B2 | 8/2013 | Hiroshige et al. | |
| 8,703,630 B2 | 4/2014 | LoFaro et al. | |
| 2002/0119331 A1 | 8/2002 | Jiang | |
| 2006/0025627 A1 | 2/2006 | Vineyard et al. | |
| 2006/0057355 A1 | 3/2006 | Suzuki et al. | |
| 2006/0269738 A1 | 11/2006 | Kimberly | |
| 2008/0176987 A1 | 7/2008 | Trevet et al. | |
| 2009/0130376 A1 | 5/2009 | Berkel et al. | |
| 2009/0326137 A1 | 12/2009 | Hsu et al. | |
| 2010/0304119 A1 | 12/2010 | Bonneau | |
| 2011/0028308 A1 | 2/2011 | Shah et al. | |
| 2012/0064283 A1 | 3/2012 | Hill et al. | |
| 2013/0029574 A1 | 1/2013 | Van Der Steen | |
| 2013/0167502 A1 | 7/2013 | Wilson et al. | |
| 2013/0221285 A1 | 8/2013 | Song et al. | |
| 2014/0295723 A1 | 10/2014 | Nelson | |
| 2015/0252184 A1 | 9/2015 | Arai | |
| 2015/0259493 A1 | 9/2015 | Nederkoorn | |

FOREIGN PATENT DOCUMENTS

| | | |
|---|---|---|
| EP | 1066224 | 12/2001 |
| EP | 2236549 | 10/2010 |
| WO | WO9501861 A1 | 1/1995 |
| WO | WO9921697 | 5/1999 |
| WO | WO2011059625 A1 | 5/2011 |
| WO | WO2014073960 | 5/2014 |
| WO | WO2014074767 A1 | 5/2014 |
| WO | WO2015097283 | 7/2015 |

OTHER PUBLICATIONS

Hackett et al., "The Effect of Nanosilica Concentration on the Enhancement of Epoxy Matrix Resins for Prepreg Composites," Society for the Advancement of Material and Process Engineering, 2010.

Nagavarma et al., "Different Techniques for Preparation of Polymeric Nanoparticles—A Review," Asian Journal of Pharmaceutical and Clinical Research, vol. 5, Suppl 3, 2012.

European Search Report for EP15186490, dated Jan. 22, 2016.

Sober, D.J., "Kaneka Core-Shell Toughening Systems for Thermosetting Resins," 2007.

Suzuki, M.; Nagai, A.; Suzuki, M., Takahashi, A.: "Relationship between Structure and Mechanical Property for Bismaleimide-Biscyanamide resin," 1992. J. App. Poly. Sci, 45, pp. 177-180.

Fan, H.; Lei, Z.; Pan, J.H.; Zhao, X.S., "Sol-gel synthesis, microstructure and adsorption properties of hollow silica spheres," Materials Letters 65 (2011), 1811-1814.

* cited by examiner

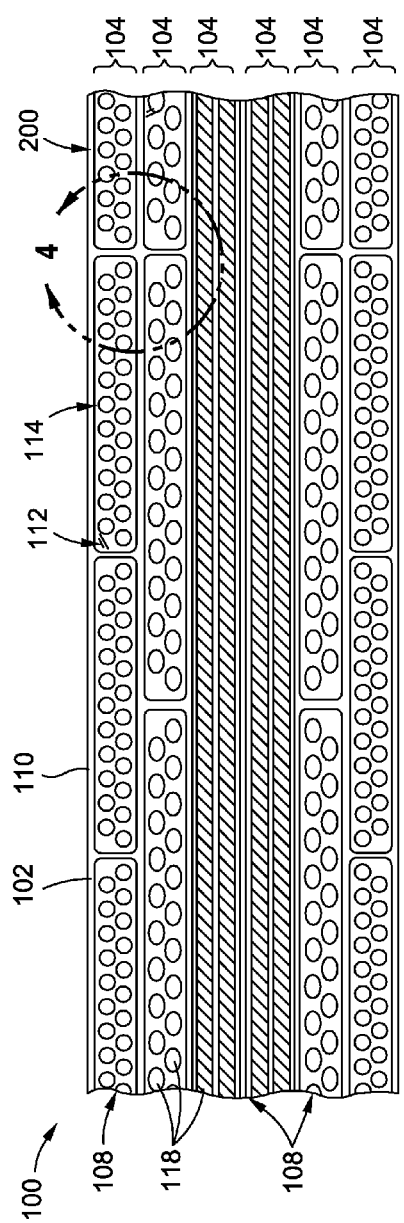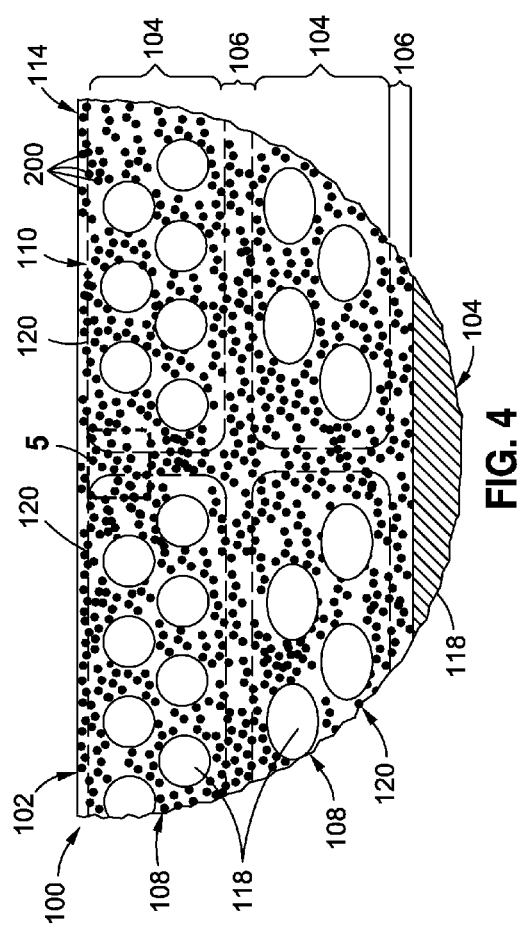

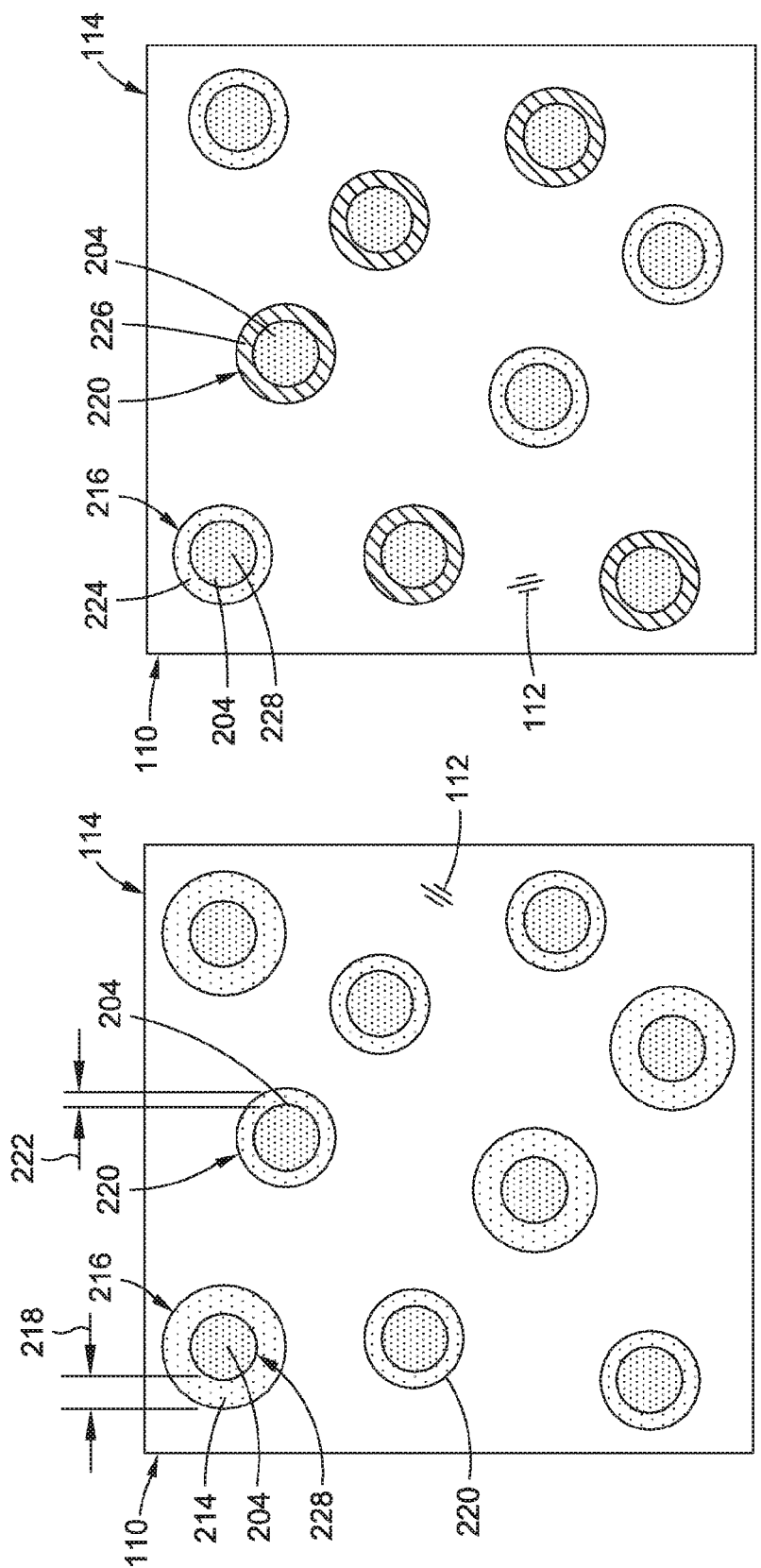

POLYMER NANOPARTICLES FOR CONTROLLING RESIN REACTION RATES

FIELD

The present disclosure relates generally to composite materials and, more particularly, to the use of polymer nanoparticles in composite layups for controlling the resin reaction rate during resin cure.

BACKGROUND

The fabrication of a composite structure may include the cutting of composite plies into predetermined shapes. Prior to cutting into shapes, the composite plies may be pre-impregnated with a mixture of resin and hardener (e.g., prepreg plies) and may be uncured or partially cured. The cut plies may be stacked on top of one another over a tooling surface (e.g., a mold surface) to form a composite layup. Each ply may be arranged such that fibers are oriented in a specific direction according to a ply stacking sequence. A vacuum bag may be placed over the composite layup and vacuum pressure may be applied to consolidate the composite layup to remove air and wrinkles from the composite layup and conform the composite layup to the tooling surface. The temperature of the composite layup may be elevated to reduce the viscosity of the resin so that the resin in each prepreg ply may flow and/or intermingle with the resin of adjacent prepreg plies.

The elevated temperature of the composite layup may initiate a curing process for the resin. During the curing process, the composite layup may be held at one or more elevated temperatures for a predetermined period of time to cure the resin into a solidified or hardened state. The curing of the resin may involve a cross-linking reaction during which the resin changes from a liquid to a solid. Heat may be generated due to the cross-linking reaction.

Up until the start of the layup process, thermoset prepregs must typically be stored at relatively cold temperatures (e.g., at 0 degrees F. or lower) to avoid the degradation of the resin and the additional curing of the resin that may otherwise occur if the prepreg were stored at room temperature. In this regard, a thermoset prepreg has a limited out-time which may be described as the amount of time that the prepreg may remain at room temperature before the prepreg starts to lose its manufacturability. For example, exceeding the out-time of a prepreg may result in a reduction of the tack or stickiness of the prepreg ply which is necessary to stabilize the ply against movement during layup. In addition, exceeding the out-time of a prepreg may result in a higher resin viscosity during the curing process, and which may compromise the ability to fully consolidate the composite layup to achieve the desired fiber volume fraction in the final composite structure.

Composite layups that are large and/or have complex geometry may require extended out-times to allow for the multiple processing steps that must be performed prior to final cure of a composite layup. For example, the fabrication of a large composite part may require several weeks of out-time at room temperature for cutting and laying up multiple prepreg composite plies, followed by vacuum bagging, consolidating, and other processing steps that may be required prior to final cure.

In conventional thermosetting resins, there is a trade-off between the length of out-time and the final required cure temperature and cure time. A thermosetting resin formulated to have a long out-time may require a relatively high cure temperature or a long cure time. A high cure temperature may present the risk of reduced properties of the cured resin and/or distortion in the shape of the final composite structure. A thermosetting resin may be formulated to have a relatively low cure temperature to avoid the drawbacks associated with high cure temperatures. However, a resin with a low cure temperature may have a relatively short out-time which may present challenges in fabricating composite parts that are large and/or have complex geometry.

As can be seen, there exists a need in the art for a resin system and method that allows for a relatively long out-time and which also has a relatively low cure temperature and/or relatively short cure time.

SUMMARY

The above-noted needs associated with resin systems are specifically addressed by the present disclosure which provides a composition that may include a thermosetting resin containing a plurality of polymer nanoparticles. At least some of the polymer nanoparticles may degrade or at least partially dissolve in the resin and release either a catalyst or a hardener during a resin curing process. The catalyst or hardener may alter the reaction rate of the resin.

In a further embodiment, disclosed is a composite layup including a thermosetting resin, a plurality of polymer nanoparticles included in the resin, and a plurality of reinforcing fibers embedded within the resin. At least some of the polymer nanoparticles in the resin may at least partially dissolve in the resin releasing either a catalyst or a hardener during a resin curing process. The catalyst or hardener may alter the reaction rate of the resin.

Also disclosed is a method of manufacturing a composition. The method may include mixing soluble and/or semi-soluble polymer nanoparticles into a thermosetting resin, and degrading or at least partially dissolving the polymer nanoparticles in the resin during curing of the resin. The method may further include releasing either a catalyst or a hardener from the polymer nanoparticles during dissolution of the polymer nanoparticles to alter the reaction rate of the resin.

The features, functions and advantages that have been discussed can be achieved independently in various embodiments of the present disclosure or may be combined in yet other embodiments, further details of which can be seen with reference to the following description and drawings below.

BRIEF DESCRIPTION OF THE DRAWINGS

These and other features of the present disclosure will become more apparent upon reference to the drawings wherein like numbers refer to like parts throughout and wherein:

FIG. 3 shows a cross-section of a portion of the composite layup;

FIG. 4 is an enlarged view of a portion of the composite layup taken along line 4 of FIG. 3 and showing a plurality of polymer nanoparticles in the resin;

FIG. 10 is a schematic illustration of a unit cell of uncured resin containing core-sheath nanoparticles wherein the sheaths have different sheath thicknesses;

FIG. 11 is a schematic illustration of a unit cell of uncured resin containing core-sheath nanoparticles wherein the sheaths have different sheath materials;

DETAILED DESCRIPTION

Figure 1:
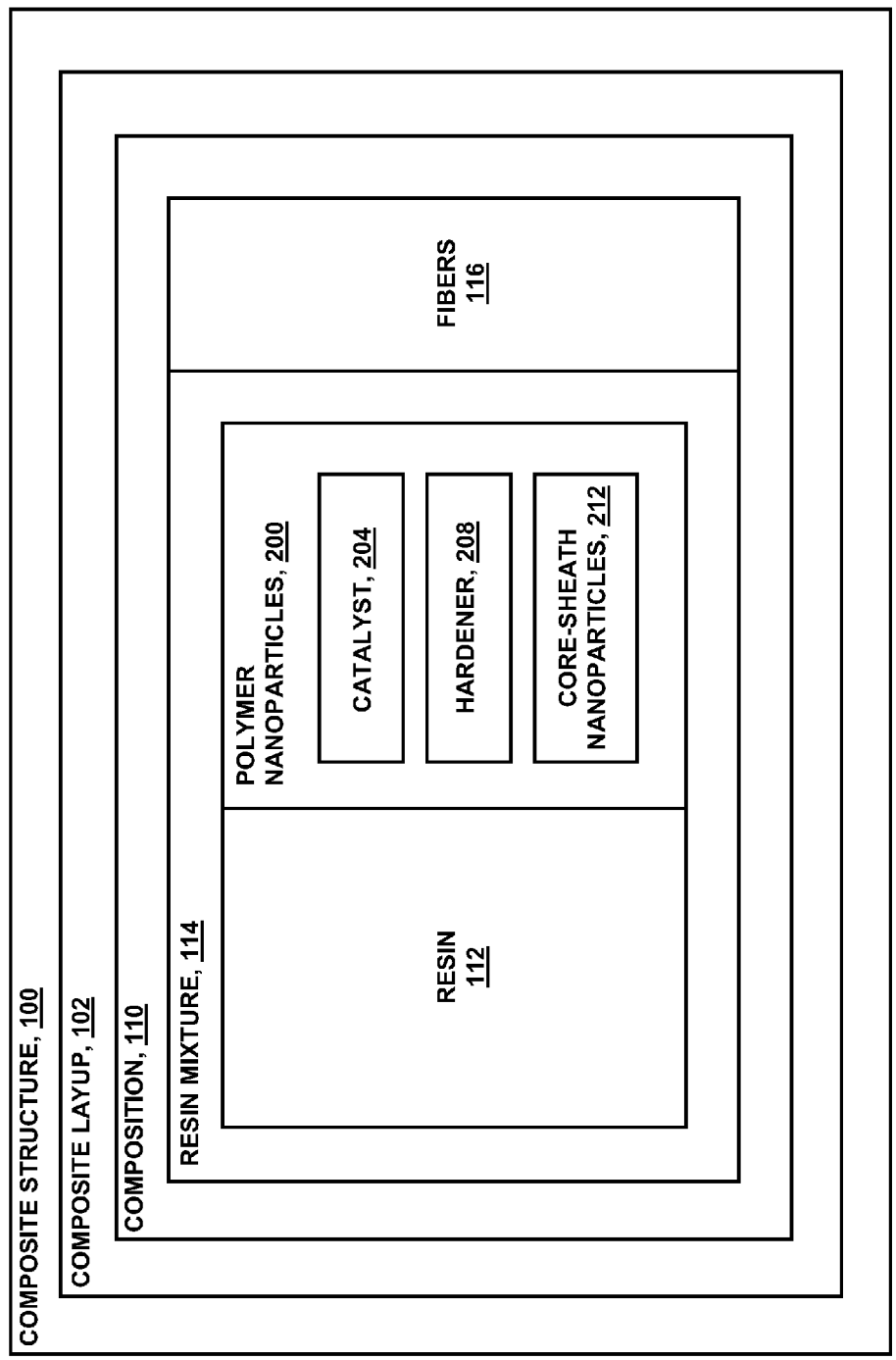
FIG. 1 is a block diagram of a composite layup including fibers embedded in resin containing polymer nanoparticles configured to release a catalyst or hardener during a resin curing process.

Referring now to the drawings wherein the showings are for purposes of illustrating various embodiments of the disclosure, shown in FIG. 1 is a block diagram of a composite structure 100 that may be fabricated from a composite layup 102. The composite layup 102 may include a composition 110 of thermosetting resin 112 containing a plurality of polymer nanoparticles 200. In some examples, the composition 110 may further include reinforcing fibers 116 or fiber tows arranged in any one of a variety of fiber forms such as unidirectional tape, woven fabric, braided fiber, and other fiber forms. Each one of the fibers 116 may include may be formed of a plurality of reinforcing filaments 118. In some examples, polymer nanoparticles 200 may be coupled to one or more reinforcing filaments 118.

Advantageously, at least some of the polymer nanoparticles 200 in the thermosetting resin matrix may be configured to release a catalyst 204 and/or hardener 208 into the resin 112 during the resin curing process as a means to alter the resin cure kinetics. For example, the release of catalyst 204 and/or hardener 208 into the resin 112 may increase the reaction rate of the resin 112 during the curing process. In some examples, the polymer nanoparticles 200 may be configured to degrade or at least partially dissolve at a predetermined temperature and/or time in the resin 112. In other examples, the polymer nanoparticles 200 may fully dissolve in the resin 112. The degradation or at least partial dissolution of the polymer nanoparticles 200 in the resin 112 may cause the release of catalyst 204 and/or hardener 208 that may be included with the polymer nanoparticles 200.

In the present disclosure, a catalyst 204 may be described as a non-reactive substance that may promote the cross-linking reaction required for resin cure. A hardener 208 may be described as a reactive component that is mixed with resin 112 in a predetermined proportion and which reacts or cross-links with the resin 112 during the resin curing process causing the resin 112 to irreversibly transition from a liquid state to a solid state. In the present disclosure, a resin mixture 114 may be described as resin 112 and polymer nanoparticles 200. As indicated above, some of the polymer nanoparticles 200 may contain catalyst 204 and/or hardener 208 for altering the reaction rate of the resin 112.

However, a resin mixture 114 may also contain polymer nanoparticles that have functionality other than altering the resin reaction rate, or such polymer nanoparticles that have a functionality in addition to altering the resin reaction rate. For example, a resin mixture 114 may contain polymer nanoparticles 200 that may be formed of thermoplastic material which may have a higher toughness than the toughness of unmodified resin. The thermoplastic polymer nanoparticles 200 may be configured to at least partially dissolved in the resin 112 which may result in an increase in the toughness of the resin 112 relative to resin without the thermoplastic polymer nanoparticles 200. For example, a resin mixture 114 may include polymer nanoparticles 200 to improve the resin modulus, strength, coefficient of thermal expansion (CTE), flammability resistance, smoke and toxicity levels, electrical conductivity, and/or corrosion resistance. In addition, a resin 112 may include polymer nanoparticles 200 to reduce cure shrinkage, heat of reaction, and/or to improve other properties of a composite layup 102 and/or composite structure 100 formed from a composite layup 102.

In the present disclosure, the polymer nanoparticles 200 may be used in a resin infusion process wherein liquid resin 112 is infused into a dry fiber composite layup 102 after which heat and/or pressure may be applied to cure the composite layup 102 and form a final composite structure 100. In addition, the present disclosure contemplates incorporating the polymer nanoparticles 200 into resin 112 that may be used to pre-impregnate any one or more of a variety of different fiber forms such as prepreg fiber tows, prepreg unidirectional tape, prepreg woven fabric, prepreg braided fibers, and other prepreg forms. The prepreg fiber forms may be arranged in a composite layup 102 after which heat and/or pressure may be applied to cure the composite layup 102. In some examples, the catalyst 204 and/or hardener 208 may be substantially uniformly dispersed throughout one or more of the polymer nanoparticles 200. In other examples, at least a portion of the polymer nanoparticles 200 may be core-sheath nanoparticles 212, as described below. In any one of the examples disclosed herein, the catalyst 204 and/or hardener 208 may be in solid form or in semi-solid form and may be soluble in the resin 112.

By increasing the resin reaction rate, the cure temperature and/or the cure time of the resin 112 may be reduced relative to resin without the polymer nanoparticles 200. In this regard, the resin 112 may be formulated to have a longer out-time than resin 112 that lacks the polymer nanoparticles 200 for the same cure time and cure temperature. An increase in out-time of the resin 112 may allow the performance of multiple processing steps (e.g., ply cutting, ply layup, vacuum bagging, consolidating, etc.) without a reduction in the manufacturability of the resin 112 prior to final cure. A reduction in cure temperature may reduce or avoid the risk of exceeding the degradation temperature or combustion temperature of the resin 112 which may otherwise result in damage to the composite layup 102 from overheating, or may result in distortion in the shape of the final composite structure 100. A reduction in cure time of the resin 112 may result in a reduction in the overall manufacturing time of the composite structure 100 and may allow for a higher production rate. Although the polymer nanoparticles 200 are described in the context of a composite layup 102, the polymer nanoparticles 200 may be included in resins 112 that may be used as adhesives, coatings, injection moldable plastic, and other applications.

Figure 2:
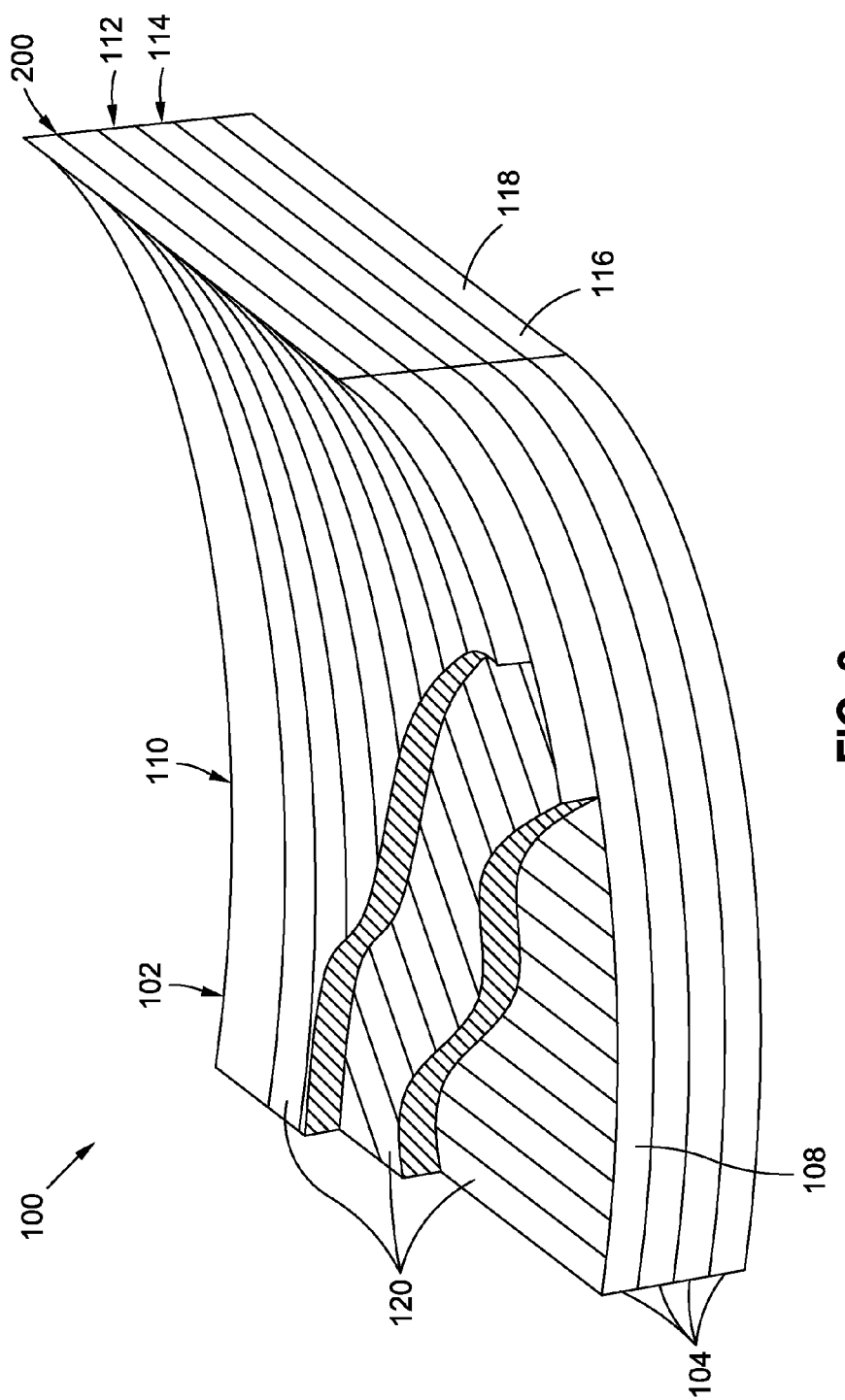
FIG. 2 is a perspective view of a composite layup including a stack of unidirectional plies.

FIG. 2 schematically illustrates a composite layup 102 formed as a stack of composite plies 104. In the example shown, the composite plies 104 are unidirectional plies 108. However, the composite plies 104 may be provided in any one of a variety of different fiber forms including, but not limited to, unidirectional tape, woven fabric, braided fibers, stitched fiber forms, chopped fiber forms, and in either type of crimp and non-crimp fiber forms. In the example shown, the unidirectional plies 108 may be dry fiber plies which may be infused with a liquid resin 112 containing polymer nanoparticles 200, or the unidirectional plies 108 may be prepreg plies which may be pre-impregnated with resin 112 containing polymer nanoparticles 200. A unidirectional ply 108 may be made up of a plurality of unidirectional tapes 120 arranged side-by-side. Each one of the unidirectional plies 108 may include parallel, continuous reinforcing fibers 116 or fiber tows. In the present disclosure, the terms fiber, composite fiber, reinforcing fiber, and fiber tow may be used interchangeably. Each fiber tow may be formed as a bundle of several thousand reinforcing filaments 118 (e.g., up to 100,000 more reinforcing filaments). In some examples, a reinforcing filament 118 may have a filament cross-sectional width or diameter of 5-30 microns. For example, a carbon reinforcing filament 118 may have a filament cross-sectional width of approximately 5-7 microns. Glass reinforcing filaments 118 may have a filament cross-sectional width of 10-25 microns.

FIG. 3 shows a cross-section of a portion of the composite layup 102 and illustrating the orientations of the reinforcing filaments 118 that make up the composite plies 104. As can be seen, the reinforcing filaments 118 in each unidirectional ply 108 may be oriented at different angles relative to the reinforcing filaments 118 in adjacent unidirectional plies 108. In the example shown, the reinforcing filaments 118 in the upper three composite plies 104 and in the lower three are oriented at a 45 degree angle relative to one another. However, any one of the composite plies 104 may include reinforcing fibers 116 oriented in parallel or non parallel relation to any of the other composite plies 104 in the composite layup 102.

As indicated above, a composite layup 102 may be formed using prepreg composite plies 104. Polymer nanoparticles 200 containing catalyst 204 and/or hardener 208 may be applied to reinforcing filaments 118 and/or fiber tows during prepregging operations. Alternatively, a composite layup 102 may be formed using dry fiber composite plies which may be later infused with resin 112 containing catalyst 204 and/or hardener 208. For example, a resin mixture 114 comprising resin 112 containing polymer nanoparticles 200 with catalyst 204 and/or hardener 208 may be infused into dry fiber composite plies using any one of a variety of suitable resin infusion processes. Alternatively, one or more resin films containing polymer nanoparticles 200 with catalyst 204 and/or hardener 208 may be laid up between one or more dry fiber composite plies. After infusion of the composite layup 102 with a resin mixture 114, the composite layup 102 may be consolidated and heat and/or pressure may be applied to cure the resin 112 to form a composite structure 100.

The resin may be a thermosetting resin 112 formed of any one of the following thermosetting materials: polyurethanes, phenolics, polyimides, sulphonated polymer (polyphenylene sulphide), a conductive polymer (e.g., polyaniline), benzoxazines, bismaleimides, cyanate esters, polyesters, epoxies, and/or silsesquioxanes. The polymer nanoparticles 200 may be formed of thermoplastic material and/or thermosetting material. Thermoplastic material may include acrylics, fluorocarbons, polyamides, polyolefins (e.g., polyethylenes, polypropylenes), polyesters, polycarbonates, polyurethanes, polyaryletherketones (e.g., polyetheretherketone (PEEK), polyetherketoneketone (PEKK), polyetherketoneetherketone (PEKEK), etc.), polyetherimides, polyethersulfone, polysulfone, and polyphenylsulfone. The polymer nanoparticles 200 may be formed of any one of the above-mentioned thermosetting materials. The reinforcing filaments 118 may be formed from materials such as carbons, silicon carbide, boron, ceramic, and metallic material. The reinforcing filaments 118 may also be formed from glass such as E-glass (alumino-borosilicate glass), S-glass (alumino silicate glass), pure silica, borosilicate glass, optical glass, and other glass compositions.

FIG. 4 is an enlarged view of a portion of the composite layup 102 of FIG. 3 and illustrating a plurality of polymer nanoparticles 200 in the resin 112. At least a portion of the polymer nanoparticles 200 may contain catalyst 204 and/or hardener 208. Advantageously, the polymer nanoparticles 200 may be provided in a relatively small particle cross-sectional width 202 or diameter relative to the filament cross-sectional width of the reinforcing filaments 118. The relatively small particle cross-sectional width 202 may minimize effect on resin viscosity. For example, the polymer nanoparticles 200 may have a particle cross-sectional width 202 or diameter of approximately 10-200 nanometers. In other examples, the polymer nanoparticles 200 may have a cross-sectional width of between 10-100 nanometers. However, for certain applications, the polymer nanoparticles 200 may have a cross-sectional width of up to 2 microns. Advantageously, the relatively small size of the polymer nanoparticles 200 minimizes the risk of premature curing of the outer portion of the polymer nanoparticles 200 which may otherwise prevent dissolution of the inner portion of the polymer nanoparticles 200. In some examples, different size polymer nanoparticles 200 may be used. For example at least some of the polymer nanoparticles 200 may have a particle cross-sectional width 202 that may be different than the particle cross-sectional of other polymer nanoparticles 200 in the resin mixture 114.

The relatively small size of the polymer nanoparticles 200 made enable the catalyst 204 and/or hardener 208 to be substantially uniformly distributed throughout the resin 112 to uniformly affect the resin reaction rate throughout the volume of the composite layup 102. In the example shown, the polymer nanoparticles 200 may be included between reinforcing filaments 118 of the unidirectional tapes 120 that make up the composite layup 102. In addition, the interlaminar regions 106 between adjacent composite plies 104 may also include a uniform distribution of polymer nanoparticles 200. Even further, polymer nanoparticles 200 may be included in the spaces between the opposing side edges of adjacent pairs of unidirectional tape. For composite layups 102 formed using other fiber forms such as woven fabric or braided fibers, the polymer nanoparticles 200 may be similarly uniformly distributed throughout the composite layup 102 to uniformly effect the resin reaction rate throughout the composite layup 102.

For example, a composite layup 102 may be formed of prepreg unidirectional tape 120 containing polymer nanoparticles 200 with catalyst 204 and/or hardener 208. After debulking and/or consolidating the composite layup 102, heat may be applied to reduce the viscosity of the resin 112 and allow the resin mixture 114 of each one of the unidirectional plies 108 to flow and intermingle with the resin mixture 114 of other unidirectional plies 108. The intermingling of the resin mixture 114 may result in the polymer nanoparticles 200 becoming generally uniformly distributed throughout the composite layup 102. The application of heat may initiate the final curing process and may accelerate the degradation and/or dissolution of the polymer nanoparticles 200 causing the release of catalyst 204 and/or hardener 208 to alter the reaction rate, as described in greater detail below.

Figure 5:
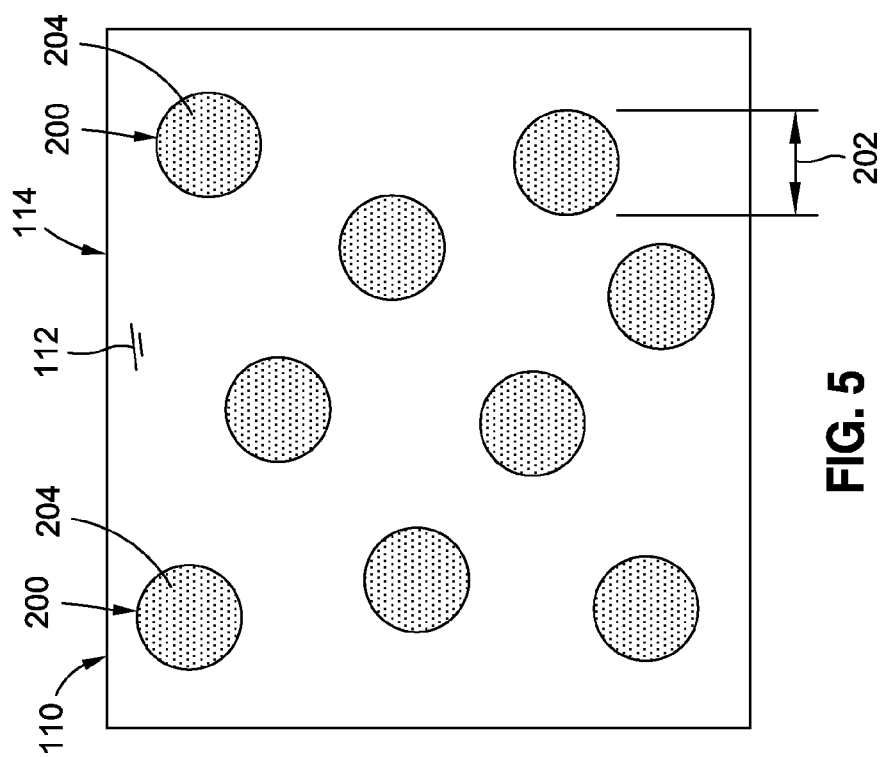
FIG. 5 is a schematic illustration of a unit cell of uncured resin taken along line 5 of FIG. 4 and illustrating polymer nanoparticles containing a catalyst.

FIG. 5 is a schematic illustration of a unit cell of uncured resin 112. The resin 112 includes polymer nanoparticles 200 containing or including a catalyst 204. The polymer nanoparticles 200 may be substantially uniformly disbursed in the resin 112 and may be fully-soluble in the resin 112. For example, a polymer nanoparticle 200 may be comprised of a blend of soluble or semi-soluble thermoplastic and a catalyst 204. As the thermoplastic dissolves into the resin 112, the catalyst 204 may be progressively released into the resin 112 to alter (e.g., increase) the reaction rate of the resin 112. In addition, the dissolution of the thermoplastic may result in localized increases in the toughness of the resin 112 to reduce or avoid the propensity for crack initiation or crack growth in the resin 112.

The polymer nanoparticles 200 may be provided in a generally rounded or spherical shape which, in combination with a relatively small particle cross-sectional width 202, may minimize effects of the polymer nanoparticles 200 on the resin viscosity even at relatively high concentration levels of the polymer nanoparticles 200 in the resin 112. In one example, the resin mixture 114 may include up to approximately 75 percent by volume of polymer nanoparticles 200 with minimal effect on resin viscosity.

In this regard, the viscosity of the resin mixture 114 may be controlled primarily by the base resin 112. In other examples, a resin mixture 114 may include from 5-50 percent by volume of polymer nanoparticles 200. In a further example, the polymer nanoparticles 200 may constitute from 10-40 percent by volume of a resin mixture 114. In a still further example, the polymer nanoparticles 200 may constitute from 20-40 percent by volume of a resin mixture 114.

The generally rounded or spherical shape of the polymer nanoparticles 200 may avoid the polymer nanoparticles 200 interlocking with other polymer nanoparticles 200 or interlocking with reinforcing filaments 118 as may otherwise occur with non-spherical or irregularly-shaped nanoparticles that may have sharp edges or corners. However, the present disclosure contemplates polymer nanoparticles provided in shapes other than spherical shapes and may include oblong or elliptical shapes, and other three-dimensional shapes including, but not limited to, cubes, rectangles, pyramids, and other shapes.

Advantageously, the relatively small size of the fully-soluble or semi-soluble polymer nanoparticles 202, 204 allows for substantially uniform dispersion of the dissolved nanoparticle material within the resin at the location each nanoparticle. More specifically, the relatively small size of the nanoparticles (e.g., 10-200 nm) results in a relatively short path length (e.g., on the order or nanometers) for the dissolved nanoparticle material to mix with the resin at the (former) location of each nanoparticle. For example, in arrangements where fully-soluble or semi-soluble polymer nanoparticles 202, 204 are uniformly dispersed throughout a composite layup, the small size of the nanoparticles 202, 204 results in substantially uniform distribution of the dissolved nanoparticle material within the resin throughout the composite layup resulting in uniformity in the improved properties of the resin throughout the composite structure. Likewise, in arrangements were fully-soluble or semi-soluble polymer nanoparticles 202, 204 are locally applied to targeted regions such as between composite plies, between opposing side edges of side-by-side fiber tows, and/or in resin-rich pockets, the small size of the nanoparticles 202, 204 allows for a substantially uniform distribution of the dissolved nanoparticle material within the resin at the targeted regions and resulting in uniformity in the improved properties of the resin and/or composite structure at such targeted regions.

Figure 6:
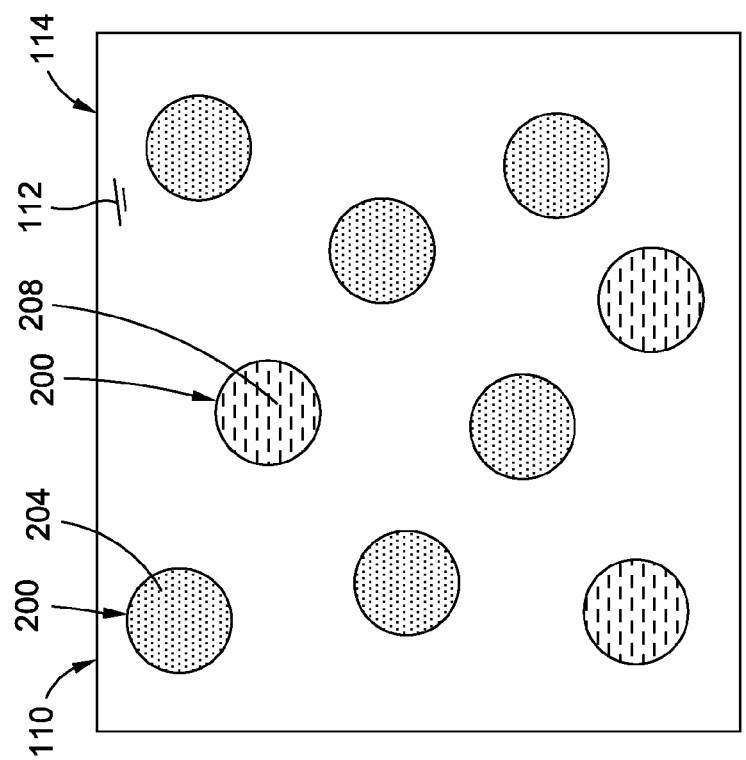
FIG. 6 is a schematic illustration of a unit cell of uncured resin containing polymer nanoparticles wherein some of the polymer nanoparticles include a catalyst and some of the polymer nanoparticles include a hardener.

FIG. 6 is a schematic illustration of a unit cell of uncured resin 112 containing polymer nanoparticles 200 wherein some of the polymer nanoparticles 200 include a catalyst 204 and some of the polymer nanoparticles 200 include a hardener 208. The polymer nanoparticles 200 may be configured to progressively dissolve into the resin 112 causing the progressive release of catalyst 204 and hardener 208 into the resin 112 to alter the resin reaction rate. In one example, the thermosetting resin 112 may be an epoxy resin 112 and the hardener 208 may be an amine. For example, the hardener 208 may be diaminodiphenyl sulfone. However, other hardeners 208 may be used. In some examples, the resin may include first polymer nanoparticles containing or comprising a hardener 208, and second polymer nanoparticles containing or comprising catalyst 204. The first polymer nanoparticles may be configured to at least partially dissolve at a different time that the second polymer nanoparticles such that the hardener 208 is released into the resin at a different time that the release of catalyst 204 into the resin. For example, the first polymer nanoparticles may be configured to at least partially dissolve prior to the second polymer nanoparticles such that the hardener 208 is released into the resin prior to release of the catalyst 204.

Figure 7:
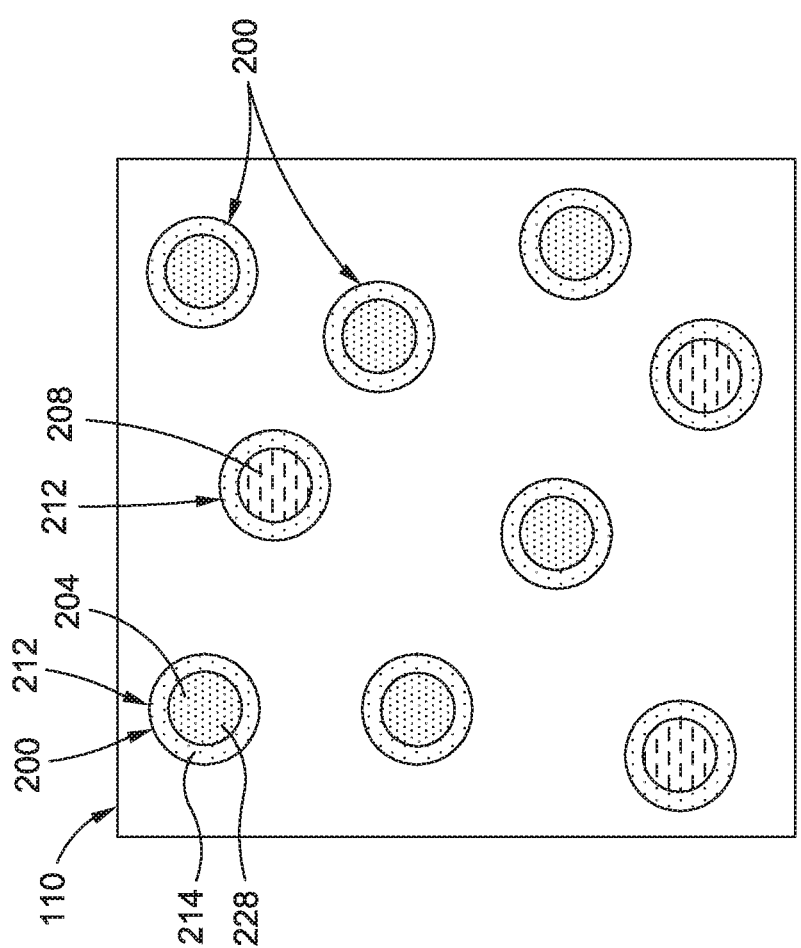
FIG. 7 is a schematic illustration of a unit cell of uncured resin containing core-sheath nanoparticles each having a sheath encapsulating a core including a catalyst or a hardener.

FIG. 7 is a schematic illustration of a unit cell of uncured resin 112 containing core-sheath nanoparticles 212. Each core-sheath nanoparticle 212 includes a sheath 214 encapsulating a core 228. The sheath 214 may be formed of at least one of the following thermoplastic materials: acrylics, fluorocarbons, polyamides, polyolefins, polyesters, polycarbonates, polyurethanes, polyaryletherketones, and polyetherimides. However, the sheath 214 may be formed of any one of the above-described materials from which the polymer nanoparticles 200 may be formed. The sheath 214 may be degradable or at least partially dissolvable in the resin 112. Degradation or at least partial dissolution of the sheath 214 may allow the resin 112 to come into contact with the core. The core 228 may include or contain a catalyst 204 or a hardener 208. The core 228 may be configured to dissolve in the resin 112. Contact of the resin 112 with a dissolving core 228 containing catalyst 204 may result in any increase in the reaction rate of the resin 112. Contact of the resin 112 with a dissolving core 228 containing hardener 208 may allow for completion of the cross-linking with the resin 112.

Figure 8:
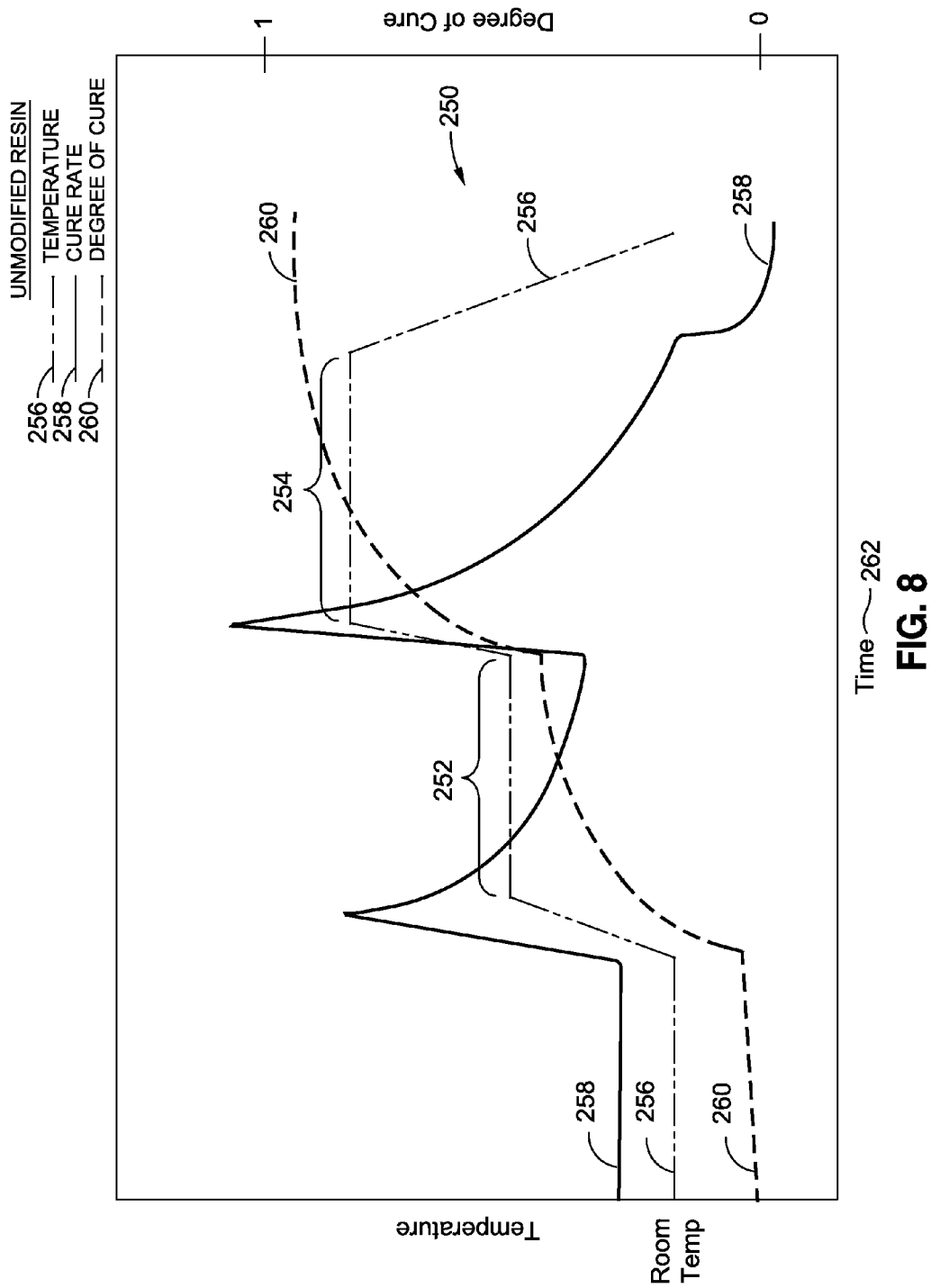
FIG. 8 is a graph of a two-step cure cycle for an unmodified thermosetting resin containing no polymer nanoparticles and illustrating the temperature, cure rate, and degree of cure during the two-step cure cycle of the unmodified thermosetting resin.

FIG. 8 is a graph of a two-step cure cycle 250 for an unmodified thermosetting resin 112 containing no polymer nanoparticles. The graph plots the temperature 256, the cure rate 258, and the degree of cure 260 of the unmodified thermosetting resin 112 over cure time 262 during the two-step cure cycle 250. In FIG. 8, the resin 112 starts out at room temperature. The cure rate 258 may be substantially constant prior to the application of heat to the resin. The resin 112 may start out with a relatively low degree of cure 260. For example, the resin 112 may initially be substantially uncured. The temperature of the resin may be increased to a first temperature hold 252 which may result in an increase in the cure rate 258 and resulting in an increase in the degree of cure 260 of the unmodified resin 112. After the first temperature hold 252 for a predetermined time period, the temperature may again be increased to a second temperature hold 254 which may result in a spike in the cure rate 258 and a gradual increase in the degree of cure 260 of the resin 112. At the end of the second temperature hold 254, the temperature may be reduced such as by discontinuing the application of heat to the resin 112 after which time the resin 112 may be substantially fully cured.

Figure 9:
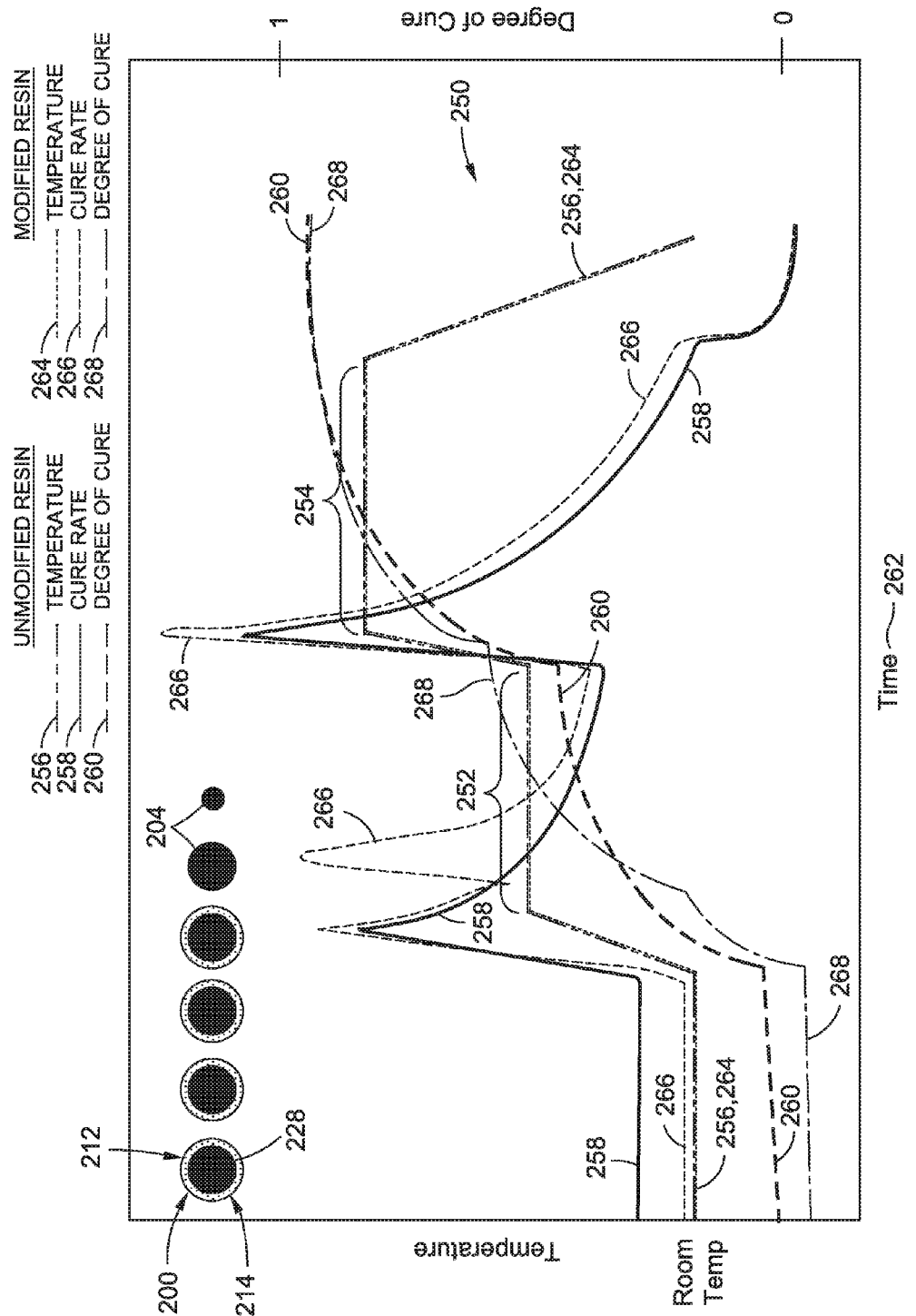
FIG. 9 is a graph of the two-step cure cycle for a resin that has been modified with polymer nanoparticles configured to release a catalyst during a first temperature hold of the two-step cure cycle.

FIG. 9 is a graph of a two-step cure cycle 250 for a resin 112 that has been modified with polymer nanoparticles 200. For the modified resin, the plots of temperature 264, cure rate 266, and degree of cure 268 are shown in dashed lines. For the unmodified resin 112, the plots of the temperature 256, cure rate 258, and degree of cure 260 are shown in solid lines as in FIG. 8. In the example of FIG. 9, the polymer nanoparticles 200 are configured as core-sheath nanoparticles 212 including a sheath 214 encapsulating a core 228 containing or formed of catalyst 204. The sheath 214 may be soluble. Also shown are schematic illustrations of polymer nanoparticles 200 illustrating the stages of dissolution of the sheath 214 and core 228 into the resin 112 as the curing cycle progresses. The polymer nanoparticles 200 may remain in a solid state below a predetermined temperature and time during resin cure, and the polymer nanoparticles 200 may degrade or at least partially dissolve in the resin 112 above the predetermined temperature and time during resin cure.

In FIG. 9, heat may be applied to the modified resin 112 causing an increase in the temperature 264 of the resin 112 from room temperature up to a first temperature hold 252. As the temperature reaches the first temperature hold 252, the sheath 214 may begin to degrade or at least partially dissolve into the resin 112 and which may result in the start of a progressive release of catalyst 204 into the resin 112. The release of catalyst 204 into the resin 112 may increase the cure rate 266 and may allow the resin 112 to achieve a relatively higher degree of cure 268 during the first temperature hold 252 than the degree of cure 260 achievable with resin lacking catalyst and/or hardener polymer nanoparticles 200. At the end of the first temperature hold 252, the temperature may again be increased to a second temperature hold 254 which may result in a spike of the cure rate 266 and a further increase in the degree of cure 268 of the resin 112 relative to the degree of cure 260 of unmodified resin 112. In this regard, FIG. 9 illustrates that the release of catalyst 204 during dissolution of the polymer nanoparticles 200 may result in a shorter cure time 262 to reach substantially full cure relative to a longer cure time 262 required for resin without the polymer nanoparticles 200.

FIG. 10 is a schematic illustration of a unit cell of uncured thermosetting resin 112 containing uniformly disbursed polymer nanoparticles 200 of two different types, including a quantity of first polymer nanoparticles 216 and a quantity of second polymer nanoparticles 220.

The second polymer nanoparticles 220 may have a different configuration and/or may be formed from different material than the first polymer nanoparticles 216. Each one of nanoparticles is shown configured as a core-sheath nanoparticle 212. Although the core 228 of the core-sheath nanoparticles 212 may be comprised of a catalyst 204 in the example shown, the core 228 may optionally be comprised of a hardener 208. The sheath 214 of the first polymer nanoparticle 216 and the second polymer nanoparticle 220 may each be configured to degrade or at least partially dissolve in the resin 112 at a predetermined temperature and time causing the release of catalyst 204 into the resin 112. The first polymer nanoparticles 216 may have a first sheath thickness 218, and the second polymer nanoparticle 220 may have a second sheath thickness 222 that may be different than the first sheath thickness 218, such that the first sheath thickness 218 may have a different dissolution time in the resin 112 than the second sheath thickness 222.

FIG. 11 is a schematic illustration of a unit cell of uncured resin 112 loaded with two different types of core-sheath nanoparticles 212 wherein the sheaths 214 are formed of different materials. The sheath 214 of the first polymer nanoparticles 216 may be formed of a first sheath material 224, and the sheath 214 of the second polymer nanoparticle 220 may be formed of a second sheath material 226 which may have a solubility that may be different than the solubility of the first sheath material 224. Although not shown, a resin mixture 114 may optionally include three or more types of polymer nanoparticles 200. For example, a resin mixture 114 may include third polymer nanoparticles that may have a different configuration and/or material than the first and/or second polymer nanoparticles 216, 220. For example, the sheath of a third polymer nanoparticle may be formed of a third sheath material and/or may have a third sheath thickness that may have a different dissolution temperature and/or time in the resin 112 than the first and second sheath material and/or thickness. As indicated above, the resin 112 may include any number of different types of polymer nanoparticles 200 for performing different functionalities including, but not limited to, altering the resin reaction rate, increasing the toughness of the resin 112, or altering any one of a variety of the above-described properties of the resin 112 or the performance of a composite structure 100 fabricated using the resin 112.

Figure 12:
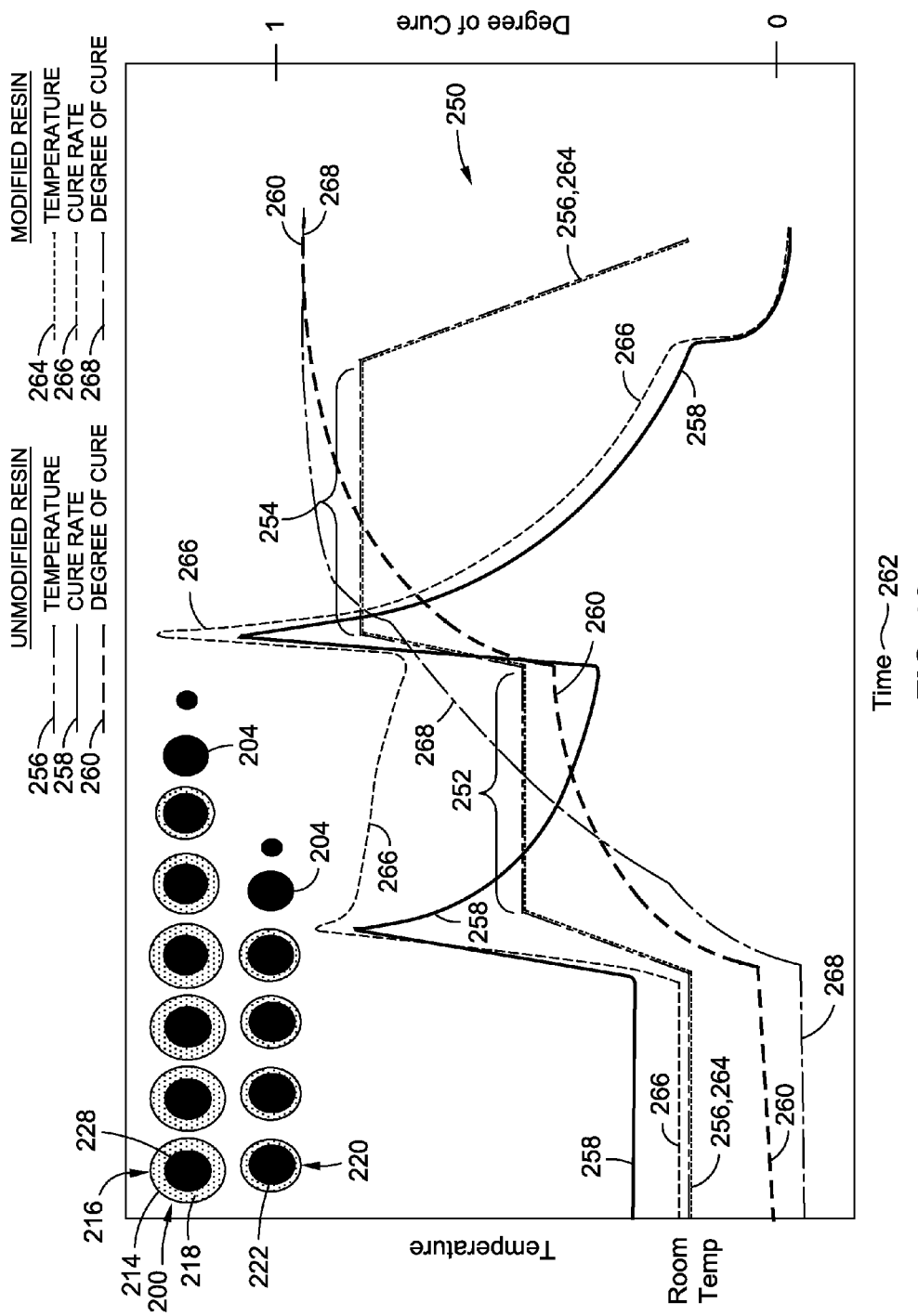
FIG. 12 is a graph of a two-step cure cycle for a resin modified with polymer nanoparticles that progressively release a catalyst during a first temperature hold of the two-step cure cycle.

FIG. 12 is a graph of a two-step cure cycle 250 for a resin 112 modified with two different types of core-sheath nanoparticles 212 including a first polymer nanoparticle 216 and a second polymer nanoparticle 220. The graph includes schematic illustrations of the core-sheath nanoparticles 212 illustrating the different rates of dissolution over time. The different rates of dissolution may be caused by the first polymer nanoparticles 200 having a first sheath thickness 218 that is different than the second sheath thickness 222 of the second polymer nanoparticles 220. Alternately, the first polymer nanoparticles 200 may be formed of a first sheath material 224 that may be different than the second sheath material 226 of the second polymer nanoparticles 220.

As the result of the different sheath thickness or the different sheath materials, the sheaths 214 of the first and second polymer nanoparticles 216, 220 may dissolve into the resin 112 over different times during the cure cycle 250. For example, the sheath 214 of the second polymer nanoparticle 220 has a reduced thickness relative to the first polymer nanoparticle 216 causing the sheath 214 of the second polymer nanoparticle 220 to dissolve sooner than the first polymer nanoparticle 216 and releasing catalyst 204 from the first polymer nanoparticle 216 to cause an increase in the cure rate 266 of the resin 112 during the increase in temperature 264 up to the first temperature hold 252. The sheath 214 of the first polymer nanoparticle 216 may be configured to dissolve shortly after the dissolution of the sheath 214 of the second polymer nanoparticle 216. The release of the additional catalyst 204 from the second polymer nanoparticle 216 may keep the cure rate 266 relatively high level throughout the first temperature hold 252 and which may result in the composite layup 102 achieving a high degree of cure 268 at the end of the first temperature hold 252 relative to the degree of cure 260 of unmodified resin at the end of the first temperature hold 252.

In some examples, the relatively high degree of cure 268 achievable during the first temperature hold 252 as a result of the progressive release of catalyst 204 may allow for sufficient curing of the composite layup 102 to enable the composite layup 102 to be removed from the tool and post-cured to its fully-cured state. In a further example, the progressive release of catalyst 204 from the polymer nanoparticles 200 may result in the composite layup 102 being cured up to its vitrification point at the end of the first temperature hold 252. Curing up to the vitrification point may allow the composite layup 102 to be post-cured with a glass transition temperature push while keeping the residual stresses substantially equivalent to residual stresses generated if the composite layup 102 were cured at the first temperature hold 252. A benefit of a relatively slow release of catalyst 204 is a reduction in the maximum temperature of the resin 112 as a result of the resin heat of reaction being distributed over a longer time period such that there is not as significant a spike in the resin temperature. In addition, a reduction in the maximum temperature of the resin 112 may also reduce shape distortion of the cured composite structure 100, and may allow the temperature of the resin 112 to be maintained below its degradation temperature limit and/or below its combustion temperature limit. Furthermore, a reduction in the maximum temperature of the resin 112 may avoid compromising the mechanical strength and performance of the final composite structure 100.

Figure 13:
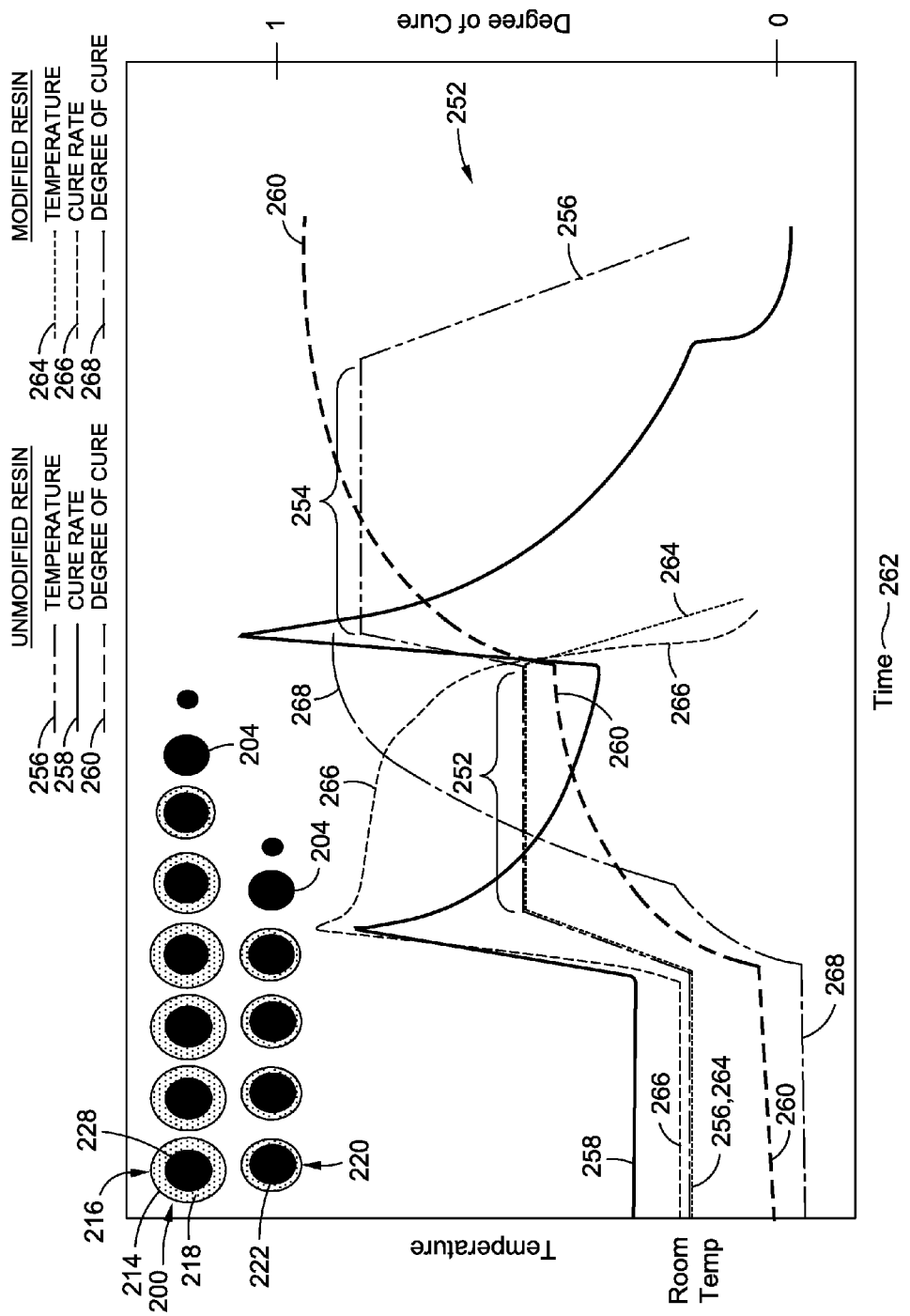
FIG. 13 is a graph of a cure cycle for a resin modified with polymer nanoparticles that progressively release a catalyst during a first temperature hold in a manner allowing full cure to be achieved during the first temperature hold.

FIG. 13 is a graph of a cure cycle 250 for a resin 112 modified with polymer nanoparticles 200 that progressively release catalyst 204 in a manner similar to the catalyst 204 release shown in FIG. 12. However, in FIG. 13, the catalyst 204 is released in an amount causing an increase in the cure rate 266 during the first temperature hold 252 such that the resin 112 fully cures during the first temperature hold 252. In this regard, the increased cure rate 266 of modified resin 112 may allow for a significant reduction in cure time 262 relative to the cure time 262 of unmodified resin having the same out-time. In addition, the temperature required for full cure of the modified resin 112 is lower than the temperature of unmodified resin with the same out-time. The reduction in the final cure temperature may advantageously result in a reduction in induced thermal stresses and associated distortion of the final shape the composite structure.

Figure 14:
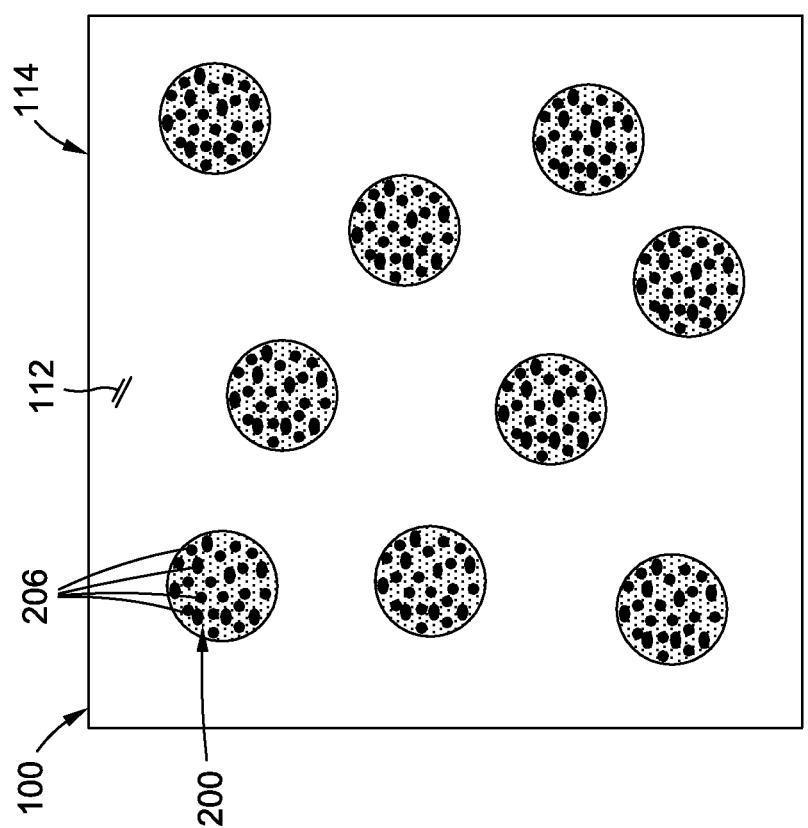
FIG. 14 is a schematic illustration of a unit cell of uncured resin containing polymer nanoparticles each containing catalyst particles dispersed throughout the polymer nanoparticle.

FIG. 14 is a schematic illustration of a unit cell of uncured resin 112 containing polymer nanoparticles 200. Each one of the polymer nanoparticles 200 contains a catalyst 204 dispersed throughout the polymer nanoparticles 200. For example, the catalyst 204 may be separated into catalyst particles 206 that may be uniformly distributed throughout the polymer nanoparticles 200. Alternatively, the polymer nanoparticles 200 may be comprised of a blend of soluble or semi-soluble polymeric material such as thermoplastic material and catalyst 204 uniformly disbursed into the polymeric material of the polymer nanoparticle 200. The polymeric material (e.g., thermoplastic material) may be configured to progressively release the catalyst 204 into the resin 112 as the polymer nanoparticles 200 dissolve. In other examples not shown, the thermoplastic material may be configured to progressively release hardener 208 into the resin 112, or release a combination of catalyst 204 and hardener 208 into the resin 112 as the polymer nanoparticles 200 dissolves.

Figure 15:
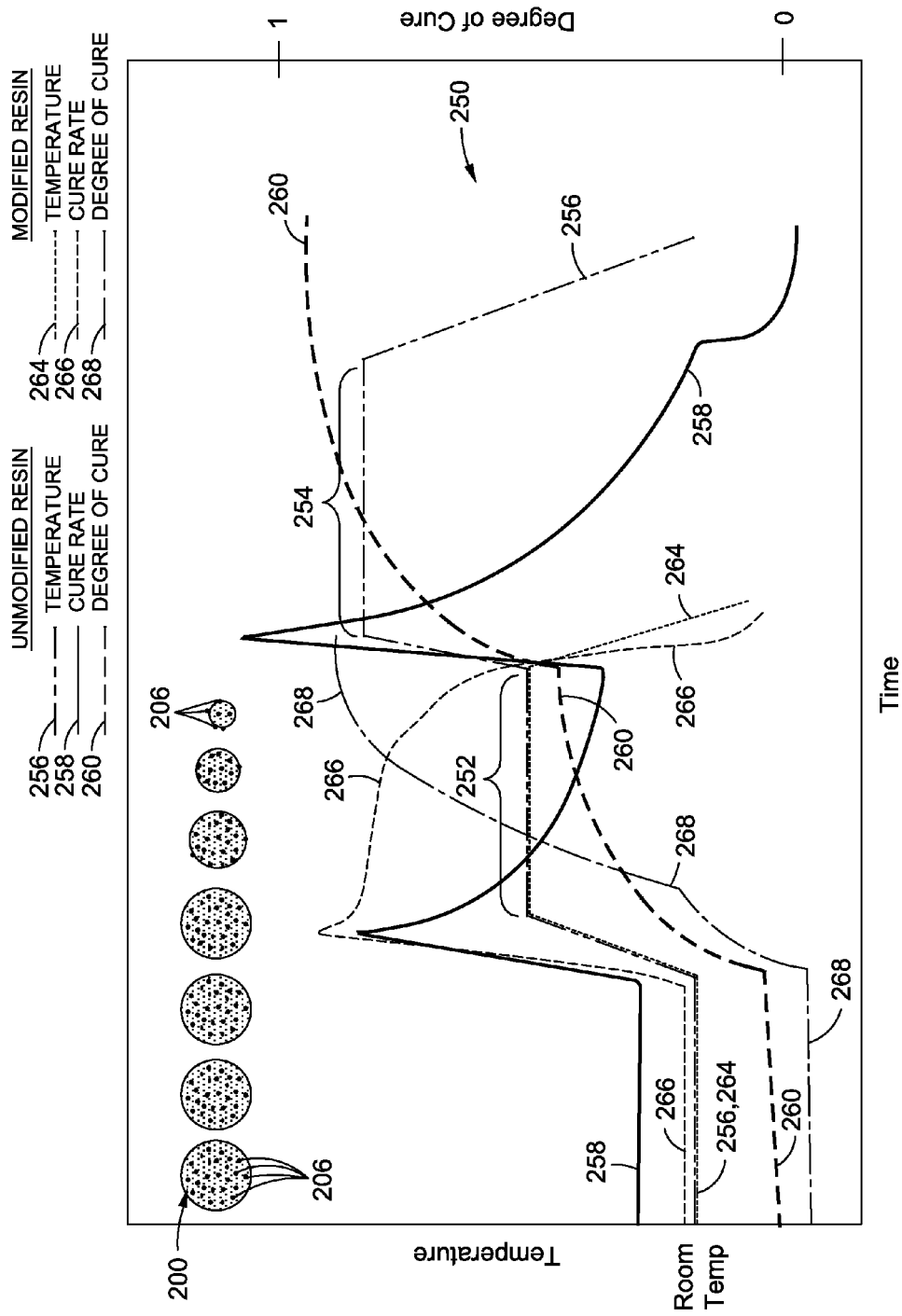
FIG. 15 is a graph of the cure cycle for a resin containing polymer nanoparticles uniformly disbursed throughout resin and allowing full cure to be achieved during the first temperature hold.

FIG. 15 is a graph of a cure cycle 250 for a resin 112 containing polymer nanoparticles 200 containing catalyst particles 206 as shown in FIG. 14. Advantageously, the substantially uniform dispersion of the catalyst particles 206 throughout each one of the polymer nanoparticles 200 may result in a controlled release of catalyst 204. As the polymer nanoparticles 200 dissolve into the resin 112, catalyst 204 is progressively released, resulting in an increase in the resin reaction rate. The dissolution rate of the thermoplastic material and the polymer nanoparticles 200 may be controlled by choice of thermoplastic chemistry.

Figure 16A:
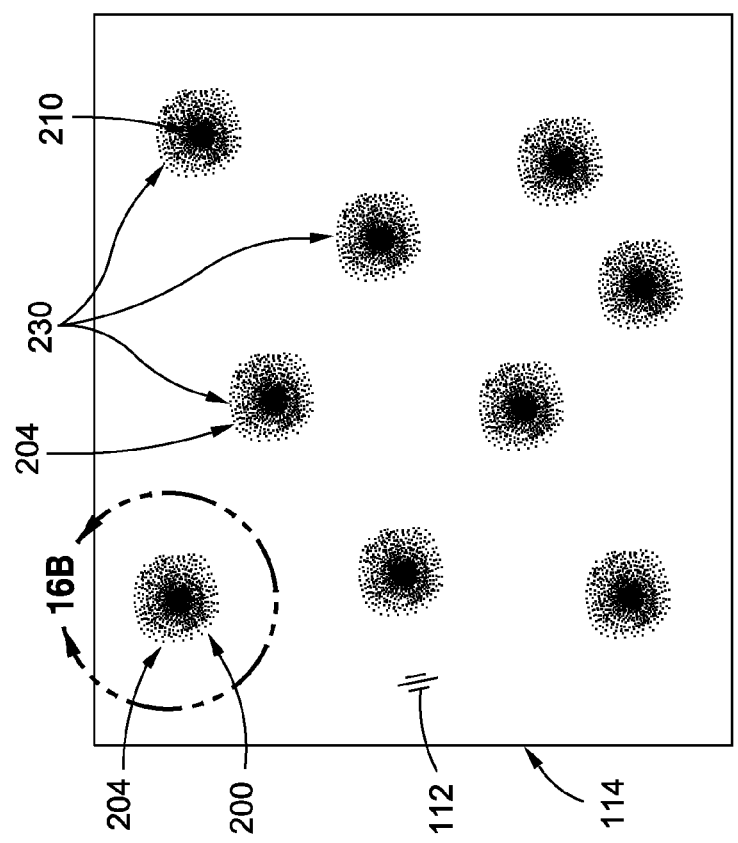
FIG. 16A is a schematic illustration of the partial dissolution of the thermoplastic polymer nanoparticles in the resin resulting in a gradient of toughness around the location of each polymer nanoparticle.
Figure 16:
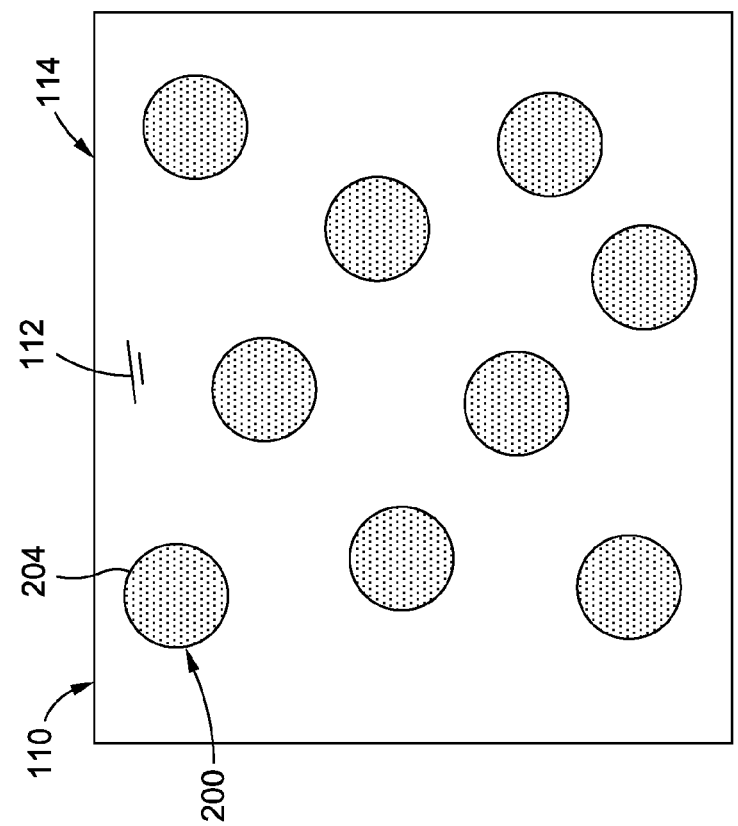
FIG. 16 is a schematic illustration of a unit cell of uncured resin containing soluble polymer nanoparticles formed of thermoplastic material and containing a catalyst.

FIG. 16 is a schematic illustration of a unit cell of uncured resin 112 containing soluble polymer nanoparticles 200 containing a catalyst 204 that may be blended with polymeric material of the polymer nanoparticles 200. In one example, the polymer nanoparticles 200 may be formed of fully-soluble thermoplastic material containing the catalyst 204. FIG. 16A schematically illustrates the at least partial dissolution of the thermoplastic polymer nanoparticles 200 in the resin 112. Due to the increased toughness of the thermoplastic material relative to the toughness of the resin 112, the dissolution of the thermoplastic material results in a gradient 230 of toughness around the location of each polymer nanoparticle 200.

Figure 16B:
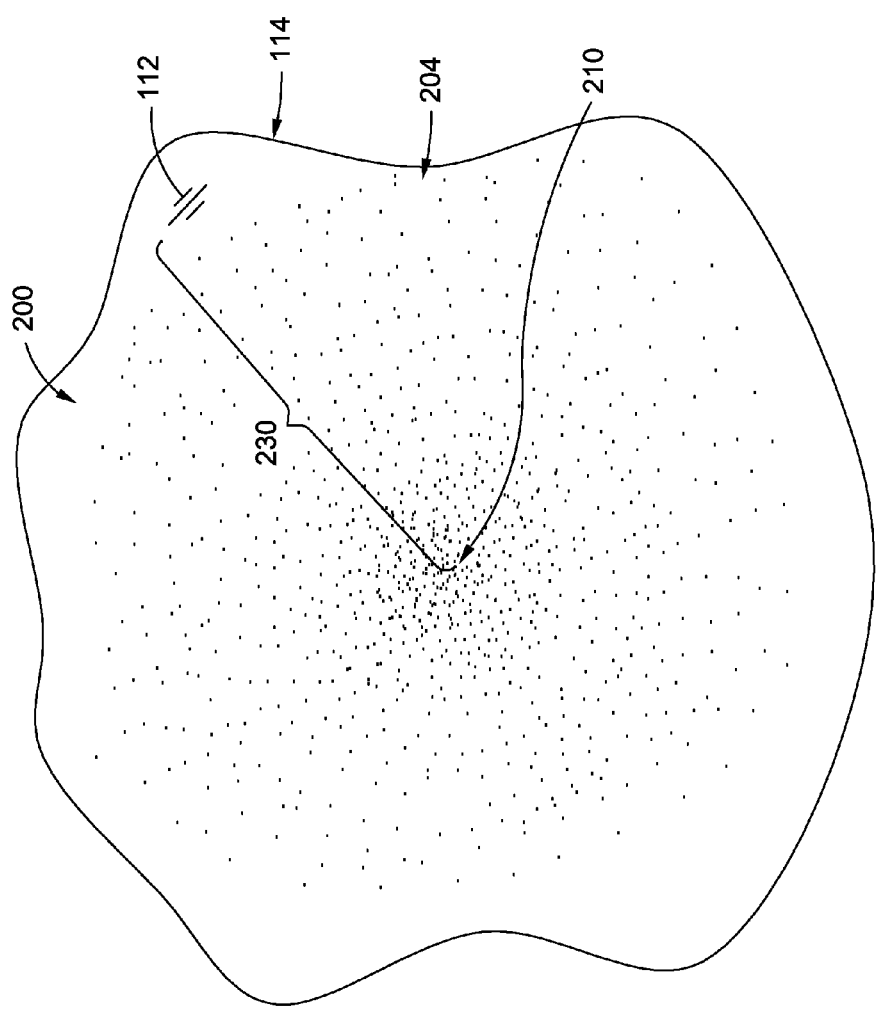
FIG. 16B is a schematic illustration of one of the semi-soluble polymer nanoparticles of FIG. 16A and schematically illustrating a gradient of toughness extending from a particle center toward the base resin surrounding the polymer nanoparticle.

FIG. 16B is a schematic illustration of one of the semi-soluble polymer nanoparticles 200 of FIG. 16A and showing a gradient 230 of toughness extending from a particle center 210 toward the base resin 112 surrounding the polymer nanoparticle 200. The base resin 112 may maintain its original chemistry around the location of each polymer nanoparticle 200. As indicated above, the polymer nanoparticles 200 may be formed of a material that provides specific functionalities that may improve the mechanical properties of the resin 112 or that may improve the performance of the final composite structure 100. Dissolution of the polymer nanoparticles 200 may alter the resin reaction rate due to the release of catalyst 204 and/or hardener 208, and may additionally result in a gradient 230 of mechanical properties including toughness, modulus, strength, and other properties around the location of each polymer nanoparticle 200.

In other examples, a mixture of polymer nanoparticles 200 containing a catalyst 204 and polymer nanoparticles 200 containing a hardener 208 may be included in a resin 112 to achieve resin phases having different properties spatially located within the resin 112. In one example, a first polymer nanoparticle 216 may contain a catalyst 204 that is released into the resin 112 and initiates a chain growth reaction or cross-linking in the resin 112 which progresses for a specific amount of time during the cure cycle 250, followed by release of a hardener 208 from a second polymer nanoparticle 220. The released hardener 208 may cross-link with the resin 112 during the resin curing process. Furthermore, two or more types of polymer nanoparticles 200 may be included in resin 112 to achieve local variations in the properties as a result of the formation of different chemistries due to the distance that the hardener 208 may diffuse within the resin 112 during the resin cure cycle 250.

As indicated above, the use of polymer nanoparticles 200 containing catalyst 204 and/or hardener 208 provide a means for controlling the resin reaction kinetics in a manner allowing for an increase in out-times and a reduction in cure temperature and/or cure time. Advantageously, such polymer nanoparticles 200 allow for the use of resins that may otherwise react too quickly and have unacceptably short out-times. In addition, the use of polymer nanoparticles 200 with catalyst 204 and/or hardener 208 provides the ability to increase and/or stabilize the resin cure rate during a temperature hold which may result in a decrease in the amount of time required to achieve full cure at a specific cure temperature.

Figure 17:
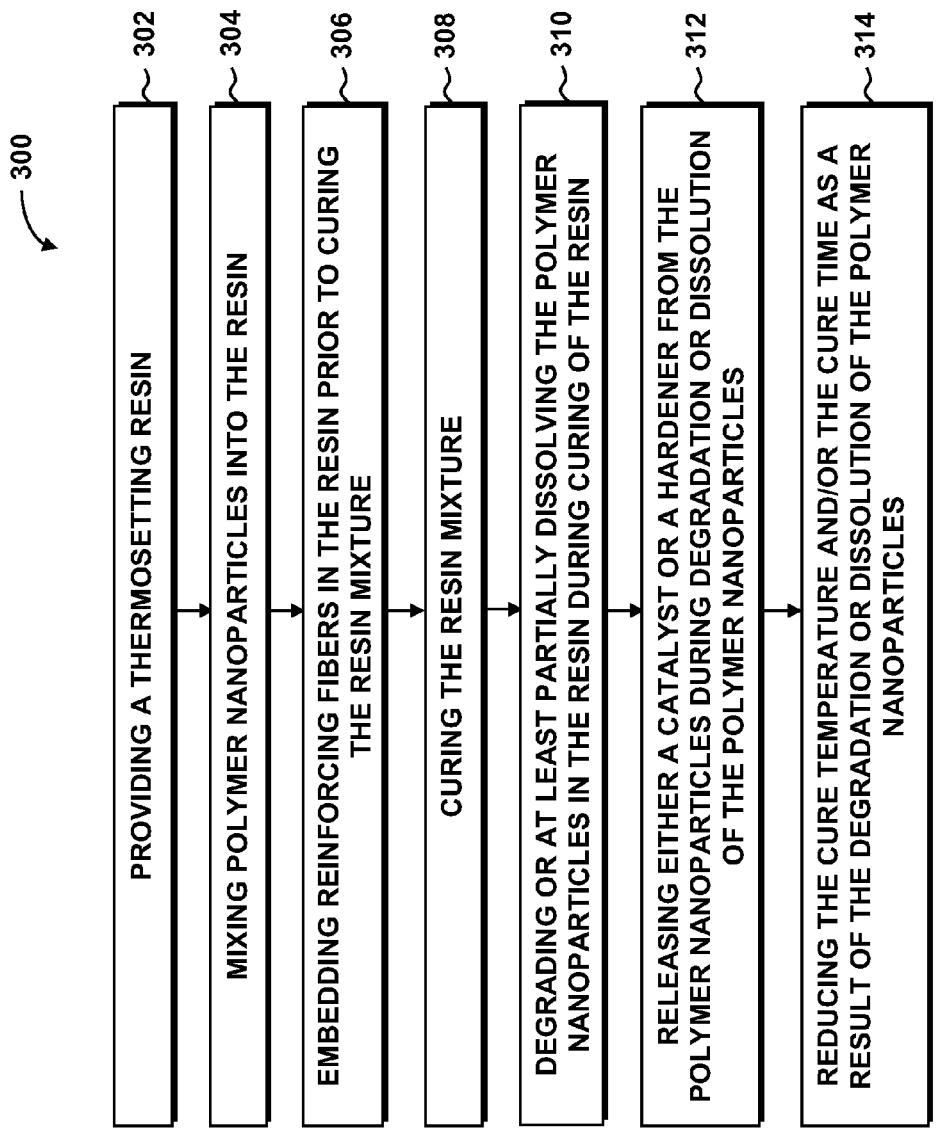
FIG. 17 is a flowchart illustrating one or more operations that may be included in a method of manufacturing a composition.

FIG. 17 is a flowchart illustrating one or more operations that may be included in a method 300 of manufacturing a composition 110. The composition 110 may include an adhesive, a coating, a plastic such as for an injection mold part, a resin for a fiber-reinforced composite layup 102, or any other type of application that may be formed using a thermosetting resin 112.

Step 302 of the method may include providing a thermosetting resin 112 in any one of the above-described materials. For example, the resin 112 may be an epoxy resin, a polyester resin, or any other type of resin.

Step 304 of the method 300 may include mixing soluble and/or semi-soluble polymer nanoparticles 200 into the thermosetting resin 112. In some examples, the method may include mixing into the resin 112 one or more configurations of polymer nanoparticles 200. For example, the polymer nanoparticles 200 may include a first polymer nanoparticle 216 type and a second polymer nanoparticle 220 type which may have a different configuration and/or material than the first polymer nanoparticle 216 type. As indicated above, the polymer nanoparticles 200 may be mixed into a prepregging resin. Alternatively, the polymer nanoparticles 200 may be mixed into a liquid resin for resin infusion of dry fibers.

Step 306 of the method 300 may include embedding reinforcing fibers 116 in the resin 112 prior to curing the resin 112. For example, prepregging resin containing polymer nanoparticles 200 may be applied to fiber tows, tape, woven fabric, braided fibers, and other fiber forms. In another example, liquid resin containing polymer nanoparticles 200 may be infused into a dry fiber layup using a suitable liquid resin infusion process such as a vacuum assisted resin transfer molding or other resin infusion system. Even further, a resin film containing polymer nanoparticles 200 may be laid up between one or more dry fiber composite plies 104 of a composite layup 102. In addition, polymer nanoparticles 200 may be directly added to dry fiber composite plies 104.

Step 308 of the method 300 may include curing the resin 112. For example, heat may be applied a composite layup 102 to elevate the temperature of the resin 112 from room temperature. The resin 112 may be cured during a curing process that may include one or more temperature holds. For example, FIG. 9 illustrates a two-step curing process including a first temperature hold 252 and a second temperature hold 254.

Step 310 of the method 300 may include degrading or at least partially dissolving the polymer nanoparticles 200 in the resin 112 during curing of the resin 112. For example, the method may include at least partially dissolving the polymer nanoparticles 200 in the resin 112 when the polymer nanoparticles 200 reach a predetermined temperature and time. The polymer nanoparticles 200 may be formulated to dissolve at different temperatures and times. For example, a first polymer nanoparticle 216 type may be dissolved at a different temperature and time than a second polymer nanoparticle 220 type. During the initial portion of the curing cycle, the method may include maintaining at least some of the polymer nanoparticles 200 in a solid state below a predetermined temperature and time, and dissolving the polymer nanoparticles 200 in the resin 112 above the predetermined temperature and time. For example, FIG. 9 graphically illustrates core-sheath nanoparticles 212 wherein the sheath 214 prevents the resin 112 from contacting the catalyst 204 core 228 until the composite layup 102 approaches or reaches a first temperature hold 252 of the cure cycle 250 at which point the sheath 214 degrades or dissolves to an extent allowing for release of the catalyst 204 into the resin 112.

Step 312 of the method 300 may include releasing either a catalyst 204 or a hardener 208 from the polymer nanoparticles 200 during dissolution of the polymer nanoparticles 200. As shown in FIG. 9, the catalyst 204 may be released when exposed to resin 112 following the dissolution of the sheath 214. A similar dissolution may occur in non-core-sheath nanoparticles which may progressively release catalyst 204 or hardener 208 as the polymer nanoparticle 200 dissolves. As indicated above, the polymer nanoparticles 200 may include first polymer nanoparticles 216 that include catalyst 204 and second polymer nanoparticles 220 that include hardener 208. The method may include releasing hardener 208 from the first polymer nanoparticle 216 type, followed by releasing the catalyst 204 from the second polymer nanoparticle 220 type after releasing the hardener 208.

For core-sheath nanoparticles 212, the step of dissolving the polymer nanoparticles 200 in the resin 112 may include dissolving the sheath 214 in the resin 112 at a predetermined temperature and time, and releasing the catalyst 204 or the hardener 208 into the resin 112 in response to dissolving the sheath 214. The core-sheath nanoparticles 212 may include first polymer nanoparticles 216 having a first sheath thickness 218, and second polymer nanoparticles 220 having a second sheath thickness 222 different than the first sheath thickness 218. The first sheath thickness 218 may be dissolved in the resin 112 over a different dissolution time than the dissolution time of the second sheath thickness 222. In another example, a first polymer nanoparticle 216 type may have a first sheath material 224, and a second polymer nanoparticle 220 type may have a second sheath material 226 which may have a different solubility than the first sheath material 224, and resulting in the first sheath material 224 dissolving over a different dissolution time than the second sheath material 226.

Step 314 of the method 300 may include reducing the cure temperature and/or the cure time of the resin 112 as a result of the releasing of a catalyst 204 or a hardener 208 in the resin 112. As indicated above, the release of the catalyst 204 and/or hardener 208 may result in curing the resin 112 within a cure time that is less than the cure time of resin without the polymer nanoparticles 200 (e.g., unmodified resin). The release of the catalyst 204 and/or hardener 208 may also result in curing the resin 112 at a cure temperature that is less than the cure temperature of resin without the polymer nanoparticles 200. The modified resin 112 may advantageously be formulated to have a longer out-time than unmodified resin having the same cure time and/or cure temperature. For embodiments of the polymer nanoparticles 200 comprised of a blend of soluble or semi-soluble thermoplastic material and catalyst 204 and/or hardener 208 as shown in FIGS. 14-15, the method may include progressively releasing the catalyst 204 and/or hardener 208 from the polymer nanoparticles 200 into the resin 112 as the polymer nanoparticles 200 degrade or at least partially dissolve.

Illustrative embodiments of the disclosure may be described in the context of a method (not shown) of manufacturing and/or servicing an aircraft, spacecraft, satellite, or other aerospace component. Pre-production, component manufacturing, and/or servicing may include specification and design of aerospace components and material procurement. During production, component and subassembly manufacturing, and system integration of aerospace components takes place. Thereafter, the aircraft, spacecraft, satellite, or other aerospace component may go through certification and delivery in order to be placed in service.

In one example, aerospace components produced by the manufacturing and servicing method may include an airframe with a plurality of systems and an interior. Examples of the plurality of systems may include one or more of a propulsion system, an electrical system, a hydraulic system, and an environmental system. Any number of other systems may be included. Although an aerospace example is shown, different illustrative embodiments may be applied to other industries, such as the automotive industry.

Apparatuses and methods embodied herein may be employed during at least one of the stages of an aerospace component manufacturing and/or servicing method. In particular, a composite structure 100 (e.g., FIG. 1), a coating, an injection-molded plastic, and/or an adhesive may be manufactured during any one of the stages of the aerospace component manufacturing and servicing method. For example, without limitation, a composite structure may be manufactured during at least one of component and subassembly manufacturing, system integration, routine maintenance and service, or some other stage of aircraft manufacturing and servicing. Still further, a composite structure may be used in one or more structures of aerospace components. For example, a composite structure may be included in a structure of an airframe, an interior, or some other part of an aircraft, spacecraft, satellite, or other aerospace component.

Additional modifications and improvements of the present disclosure may be apparent to those of ordinary skill in the art. Thus, the particular combination of parts described and illustrated herein is intended to represent only certain embodiments of the present disclosure and is not intended to serve as limitations of alternative embodiments or devices within the spirit and scope of the disclosure.

What is claimed is:

1. A composition, comprising:
   a thermosetting resin;
   a plurality of polymer nanoparticles;
   at least some of the polymer nanoparticles at least partially dissolve in the resin releasing either a catalyst or a hardener during a resin curing process, the catalyst or hardener altering a reaction rate of the resin;
   the polymer nanoparticles include a first polymer nanoparticle and a second polymer nanoparticle, the first polymer nanoparticle dissolves at a different temperature and/or at a different time than the second polymer nanoparticle, the first polymer nanoparticle and the second polymer nanoparticle being provided as at least one of the following:
      the first polymer nanoparticle being formed as a core-sheath nanoparticle and the second polymer nanoparticle being formed as a non-core-sheath nanoparticle; and
      the first polymer nanoparticle being formed of a different material than the second nanoparticle.

2. The composition of claim 1, wherein:
   at least some of the polymer nanoparticles degrade in the resin releasing either a catalyst or a hardener during the resin curing process.

3. The composition of claim 1, wherein:
   the resin has a longer out-time than resin without polymer nanoparticles for the same cure time and/or cure temperature.

4. The composition of claim 1, wherein:
   the resin has a cure time that is less than the cure time of resin without the polymer nanoparticles.

5. The composition of claim 1, wherein:
   the resin has a cure temperature that is less than the cure temperature of resin without the polymer nanoparticles.

6. The composition of claim 1, wherein:
   the polymer nanoparticles are spherical.

7. The composition of claim 1, wherein:
   the polymer nanoparticles have a particle cross-sectional width of 10-200 nanometers.

8. The composition of claim 1, wherein:
   the polymer nanoparticles constitute up to 75 percent by volume of the resin.

9. The composition of claim 1, wherein the resin is comprised of at least one of the following thermosetting materials:
   polyurethanes, phenolics, polyimides, sulphonated polymer, a conductive polymer, benzoxazines, bismaleimides, cyanate esthers, polyesters, epoxies, and silsesquioxanes.

10. The composition of claim 1, wherein at least some of the polymer nanoparticles are comprised of at least one of the following:
    thermoplastic material, acrylics, fluorocarbons, polyamides, polyolefins, polyesters, polycarbonates, polyurethanes, polyaryletherketones, polyetherimides;
    thermosetting material, polyurethanes, phenolics, polyimides, sulphonated polymer, a conductive polymer, benzoxazines, bismaleimides, cyanate esthers, polyesters, epoxies, and silsesquioxanes.

11. The composition of claim 1, wherein:
    the first polymer nanoparticle dissolves at both a different temperature and a different time than the second polymer nanoparticle.

12. The composition of claim 1, wherein:
    the first polymer nanoparticle includes hardener;
    the second polymer nanoparticle including catalyst; and
    the first polymer nanoparticle configured to at least partially dissolve and/or release hardener at a different time than the second polymer nanoparticle at least partially dissolving and/or releasing catalyst.

13. The composition of claim 1, wherein:
    at least some of the polymer nanoparticles include core-sheath nanoparticles each comprising a sheath encapsulating a core containing the catalyst or the hardener.

14. The composition of claim 13, wherein:
the core-sheath nanoparticles include a first polymer nanoparticle and a second polymer nanoparticle, the first polymer nanoparticle having a first sheath thickness, the second polymer nanoparticle having a second sheath thickness different than the first sheath thickness; and
the first sheath thickness having a different dissolution time in the resin than the second sheath thickness.

15. The composition of claim 13, wherein:
at least some of the core-sheath nanoparticles include a first polymer nanoparticle and a second polymer nanoparticle, the sheath of the first polymer nanoparticle being formed of a first sheath material having a first solubility, the sheath of the second polymer nanoparticle being formed of a second sheath material having a second solubility that is different than the first solubility.

16. The composition of claim 1, wherein:
at least some of the polymer nanoparticles causing the resin to have at least one of the following properties relative to the properties of resin without polymer nanoparticles: increased toughness, increased flammability resistance, reduced smoke, reduced toxicity, increased electrical conductivity, reduced cure shrinkage, and reduced heat-of-reaction.

17. The composition of claim 1, wherein:
the resin and polymer nanoparticles with catalyst and/or hardener are included in at least one of the following: a coating, an adhesive, an injection moldable plastic, and a resin matrix of a composite structure.

18. A composition, comprising:
a thermosetting resin;
a plurality of polymer nanoparticles;
at least some of the polymer nanoparticles at least partially dissolve in the resin releasing either a catalyst or a hardener during a resin curing process, the catalyst or hardener altering a reaction rate of the resin;
the polymer nanoparticles being core-sheath nanoparticles comprising first polymer nanoparticles and second polymer nanoparticles provided as at least one of the following:
the first polymer nanoparticles having a first sheath thickness and the second polymer nanoparticles having a second sheath thickness different than the first sheath thickness and having a different dissolution time in the resin than the first sheath thickness; and
the first polymer nanoparticles being formed of a first sheath material and the second polymer nanoparticles being formed of a second sheath material different than the first sheath material and having a different dissolution time in the resin than the first sheath material.

19. A composite layup, comprising:
a thermosetting resin;
a plurality of polymer nanoparticles included in the resin;
at least some of the polymer nanoparticles at least partially dissolve in the resin releasing either a catalyst or a hardener during a curing process, the catalyst or hardener altering a reaction rate of the resin;
the polymer nanoparticles include a first polymer nanoparticle and a second polymer nanoparticle, the first polymer nanoparticle dissolves at a different temperature and/or at a different time than the second polymer nanoparticle, the first polymer nanoparticle and the second polymer nanoparticle being provided as at least one of the following:
the first polymer nanoparticle being formed as a core-sheath nanoparticle and the second polymer nanoparticle being formed as a non-core-sheath nanoparticle; and
the first polymer nanoparticle being formed of a different material than the second polymer nanoparticle; and
a plurality of reinforcing fibers embedded within the resin.

20. The composite layup of claim 19, wherein:
the fibers have at least one of the following configurations: fiber tows, unidirectional tape, woven fabric, and/or braided fibers.

21. A method of manufacturing a composition, comprising:
mixing soluble and/or semi-soluble polymer nanoparticles into a thermosetting resin, the polymer nanoparticles including a first polymer nanoparticle and a second polymer nanoparticle having a different configuration and/or material than the first polymer nanoparticle, the first polymer nanoparticle and the second polymer nanoparticle being provided as at least one of the following:
the first polymer nanoparticle being formed as a core-sheath nanoparticle and the second polymer nanoparticle being formed as a non-core-sheath nanoparticle; and
the first polymer nanoparticle being formed of a different material than the second polymer nanoparticle;
at least partially dissolving the polymer nanoparticles in the resin during curing of the resin;
dissolving the first polymer nanoparticle at a different temperature and/or a different time than the second polymer nanoparticle; and
releasing either a catalyst or a hardener from the polymer nanoparticles during dissolution of the polymer nanoparticles.

22. The method of claim 21, wherein:
the resin has a longer out-time than resin without polymer nanoparticles for the same cure time and/or cure temperature.

23. The method of claim 21, wherein:
curing the resin within a cure time that is less than the cure time of resin without the polymer nanoparticles.

24. The method of claim 21, wherein:
curing the resin at a cure temperature that is less than the cure temperature of resin without the polymer nanoparticles.

25. The method of claim 21, wherein
the first polymer nanoparticle is a different configuration and a different material than the second polymer nanoparticle.

26. The method of claim 21, wherein the step of dissolving the first polymer nanoparticle at a different temperature and/or a different time than the second polymer nanoparticle comprises:
dissolving the first polymer nanoparticle at both a different temperature and a different time than the second polymer nanoparticle.

27. The method of claim 21, wherein the first polymer contains or comprises hardener, and the second polymer nanoparticle contains or comprises catalyst, the step of dissolving the first polymer nanoparticles at a different temperature and/or a different time than the second polymer nanoparticles comprises:

dissolving the first polymer nanoparticles and releasing hardener into the resin at a different time than when dissolving the second polymer nanoparticles and releasing catalyst into the resin.

28. The method of claim 21, wherein at least some of the polymer nanoparticles include core-sheath nanoparticles each comprising a sheath encapsulating a core formed of the catalyst or the hardener, the step of at least partially dissolving the polymer nanoparticles in the resin including:

dissolving the sheath in the resin at a predetermined temperature and time; and releasing the catalyst or the hardener into the resin in response to dissolving the sheath.

29. The method of claim 28, wherein the core-sheath nanoparticles include a first polymer nanoparticle and a second polymer nanoparticle, the first polymer nanoparticle having a first sheath thickness, the second polymer nanoparticle having a second sheath thickness different than the first sheath thickness, the step of at least partially dissolving the polymer nanoparticles in the resin including:

dissolving the first sheath thickness over a different dissolution time than the second sheath thickness.

30. The method of claim 28, wherein the core-sheath nanoparticles include a first polymer nanoparticle and a second polymer nanoparticle, the first polymer nanoparticle having a first sheath material, the second polymer nanoparticle having a second sheath material having a different solubility than the first sheath material, the step of least partially dissolving the polymer nanoparticles in the resin including:

dissolving the first sheath material over a different dissolution time than the second sheath material.

\* \* \* \* \*